(12) United States Patent
Yamazaki et al.

(10) Patent No.: US 10,804,407 B2
(45) Date of Patent: Oct. 13, 2020

(54) LASER PROCESSING APPARATUS AND STACK PROCESSING APPARATUS

(71) Applicant: Semiconductor Energy Laboratory Co., Ltd., Atsugi-shi, Kanagawa-ken (JP)

(72) Inventors: Shunpei Yamazaki, Setagaya (JP); Yoshiharu Hirakata, Tochigi (JP); Naoto Kusumoto, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 634 days.

(21) Appl. No.: 15/589,301

(22) Filed: May 8, 2017

(65) Prior Publication Data

US 2017/0330973 A1 Nov. 16, 2017

(30) Foreign Application Priority Data

May 12, 2016 (JP) ................................ 2016-096205

(51) Int. Cl.
| | |
|---|---|
| *H01L 29/786* | (2006.01) |
| *B23K 26/073* | (2006.01) |
| *B23K 26/06* | (2014.01) |
| *B23K 26/08* | (2014.01) |
| *H01L 27/12* | (2006.01) |
| *B23K 26/12* | (2014.01) |
| *B23K 101/40* | (2006.01) |

(52) U.S. Cl.
CPC ...... *H01L 29/7869* (2013.01); *B23K 26/0643* (2013.01); *B23K 26/0648* (2013.01); *B23K 26/0738* (2013.01); *B23K 26/083* (2013.01); *B23K 26/12* (2013.01); *B23K 26/1224* (2015.10); *H01L 27/1266* (2013.01); *B23K 2101/40* (2018.08); *H01L 27/1225* (2013.01)

(58) Field of Classification Search
CPC ............ H01L 29/7869; H01L 27/1266; H01L 27/1225; B23K 26/1224; B23K 26/0643; B23K 26/0738; B23K 26/083; B23K 26/12; B23K 2101/40
USPC ........................................................ 359/861
See application file for complete search history.

(56) References Cited

U.S. PATENT DOCUMENTS

| 3,695,756 | A | 10/1972 | Smith |
|---|---|---|---|
| 5,624,525 | A | 4/1997 | Ehara et al. |

(Continued)

FOREIGN PATENT DOCUMENTS

| EP | 1589796 A | 10/2005 |
|---|---|---|
| JP | 2004-260146 A | 9/2004 |

(Continued)

*Primary Examiner* — Collin X Beatty
(74) *Attorney, Agent, or Firm* — Robinson Intellectual Property Law Office; Eric J. Robinson

(57) ABSTRACT

A laser processing apparatus and a stack processing apparatus are provided. The laser processing apparatus can perform steps selectively by switching of optical paths. The steps are a step in which a first surface of a flat-plate structure is irradiated with a laser and a step in which a surface opposite to the first surface of the structure is irradiated with the laser. The laser is a linear laser whose shape on the irradiated surface is a rectangle. By laser irradiation performed while the structure is moved in the horizontal direction, the whole or a desired region of the first surface or the opposite surface of the structure can be processed.

6 Claims, 28 Drawing Sheets

(56) References Cited

U.S. PATENT DOCUMENTS

| | | |
|---|---|---|
| 5,807,460 A | 9/1998 | Yamamoto |
| 5,972,452 A | 10/1999 | Takahashi et al. |
| 6,030,421 A | 2/2000 | Gauthier et al. |
| 6,199,738 B1 | 3/2001 | Kondo et al. |
| 6,227,276 B1 | 5/2001 | Kim et al. |
| 6,258,666 B1 | 7/2001 | Mizutani et al. |
| 6,332,264 B1 | 12/2001 | Itoh et al. |
| 6,374,479 B1 | 4/2002 | Sasaki et al. |
| 6,409,159 B1 | 6/2002 | Asai et al. |
| 6,427,748 B1 | 8/2002 | Yanagita et al. |
| 6,556,189 B1 | 4/2003 | Takahata et al. |
| 6,757,964 B2 | 7/2004 | Sasaki et al. |
| 6,897,889 B2 | 5/2005 | Tanaka |
| 6,976,302 B2 | 12/2005 | Itoh et al. |
| 7,138,306 B2 * | 11/2006 | Tanaka ............... H01L 21/268 438/166 |
| 7,169,636 B2 | 1/2007 | Maruyama et al. |
| 7,182,234 B2 | 2/2007 | Rayssac et al. |
| 7,195,988 B2 | 3/2007 | Nemoto et al. |
| 7,282,380 B2 | 10/2007 | Maruyama et al. |
| 7,337,819 B2 | 3/2008 | Mizuta |
| 7,404,919 B2 | 7/2008 | Yokoyama et al. |
| 7,540,079 B2 | 6/2009 | Okuyama et al. |
| 7,569,859 B2 | 8/2009 | Maruyama et al. |
| 7,709,932 B2 | 5/2010 | Nemoto et al. |
| 8,040,456 B2 | 10/2011 | Yamazaki et al. |
| 8,044,411 B2 | 10/2011 | Maruyama et al. |
| 8,048,690 B2 | 11/2011 | Terada et al. |
| 8,058,146 B2 | 11/2011 | Kuwabara |
| 8,083,115 B2 | 12/2011 | Rayssac et al. |
| 8,106,341 B2 | 1/2012 | Kawakami et al. |
| 8,216,876 B2 | 7/2012 | Yasumatsu |
| 8,218,105 B2 | 7/2012 | Yamazaki et al. |
| 8,237,176 B2 | 8/2012 | Maruyama et al. |
| 8,360,129 B2 | 1/2013 | Ebata et al. |
| 8,367,440 B2 | 2/2013 | Takayama et al. |
| 8,415,208 B2 | 4/2013 | Takayama et al. |
| 8,482,011 B2 | 7/2013 | Maruyama et al. |
| 8,634,041 B2 | 1/2014 | Yamazaki et al. |
| 8,975,160 B2 | 3/2015 | Takano |
| 9,088,006 B2 | 7/2015 | Yamazaki et al. |
| 9,214,640 B2 | 12/2015 | Lee et al. |
| 9,333,736 B2 | 5/2016 | Kumakura et al. |
| 9,427,949 B2 | 8/2016 | Ohno et al. |
| 9,437,831 B2 | 9/2016 | Yamazaki et al. |
| 9,455,418 B2 | 9/2016 | Ohno et al. |
| 9,770,894 B2 | 9/2017 | Ohno et al. |
| 9,981,457 B2 | 5/2018 | Hirakata et al. |
| 2002/0007553 A1 | 1/2002 | Itoh et al. |
| 2002/0029849 A1 | 3/2002 | Ohmi et al. |
| 2002/0053137 A1 | 5/2002 | Sasaki et al. |
| 2003/0047280 A1 | 3/2003 | Takayama et al. |
| 2004/0166653 A1 | 8/2004 | Kerdiles et al. |
| 2005/0023647 A1 | 2/2005 | Nemoto et al. |
| 2005/0173072 A1 | 8/2005 | Mizuta |
| 2005/0214984 A1 | 9/2005 | Maruyama et al. |
| 2005/0253290 A1 | 11/2005 | Yokoyama et al. |
| 2006/0038260 A1 | 2/2006 | Nemoto et al. |
| 2006/0131260 A1 | 6/2006 | Okuyama et al. |
| 2007/0292997 A1 | 12/2007 | Maruyama et al. |
| 2008/0146017 A1 | 6/2008 | Kato |
| 2008/0233669 A1 | 9/2008 | Hirakata et al. |
| 2008/0246190 A1 | 10/2008 | Yokoyama et al. |
| 2008/0259575 A1 | 10/2008 | Tanimura et al. |
| 2009/0134786 A1 | 5/2009 | Matsuzaki et al. |
| 2010/0197054 A1 | 8/2010 | Yonehara |
| 2010/0279578 A1 | 11/2010 | Matsuzaki et al. |
| 2011/0065217 A1 | 3/2011 | Terada et al. |
| 2011/0198040 A1 | 8/2011 | Ebata et al. |
| 2011/0318906 A1 | 12/2011 | Chida et al. |
| 2012/0034407 A1 | 2/2012 | Yamanaka et al. |
| 2012/0217516 A1 | 8/2012 | Hatano et al. |
| 2012/0247685 A1 | 10/2012 | Burrows et al. |
| 2013/0062020 A1 | 3/2013 | Ries et al. |
| 2013/0178004 A1 | 7/2013 | Hirakata et al. |
| 2013/0214324 A1 | 8/2013 | Takayama et al. |
| 2014/0183473 A1 | 7/2014 | Lee et al. |
| 2014/0234664 A1 | 8/2014 | Yasumoto et al. |
| 2014/0287567 A1 | 9/2014 | Takano |
| 2015/0020979 A1 | 1/2015 | Maeda |
| 2015/0059986 A1 | 3/2015 | Komatsu et al. |
| 2015/0059987 A1 | 3/2015 | Kumakura et al. |
| 2015/0060933 A1 | 3/2015 | Ohno et al. |
| 2015/0068683 A1 | 3/2015 | Ohno et al. |
| 2015/0151531 A1 | 6/2015 | Ohno et al. |
| 2015/0195922 A1 | 7/2015 | Yasuda |
| 2015/0268357 A1 | 9/2015 | Nitta et al. |
| 2015/0367622 A1 | 12/2015 | Adachi et al. |
| 2016/0093683 A1 | 3/2016 | Lee et al. |
| 2016/0243812 A1 | 8/2016 | Kumakura et al. |
| 2016/0332826 A1 | 11/2016 | Ohno et al. |

FOREIGN PATENT DOCUMENTS

| | | |
|---|---|---|
| JP | 2009-117181 A | 5/2009 |
| JP | 2012-178591 A | 9/2012 |
| JP | 2013-137908 A | 7/2013 |
| JP | 2013-179237 A | 9/2013 |
| JP | 2014-194896 A | 10/2014 |
| JP | 2014-197522 A | 10/2014 |
| JP | 2015-064468 A | 4/2015 |
| JP | 2015-083373 A | 4/2015 |
| JP | 2015-173088 A | 10/2015 |
| JP | 2016-036005 A | 3/2016 |
| WO | WO-2006/033451 | 3/2006 |
| WO | WO-2009/104371 | 8/2009 |
| WO | WO-2016/017806 | 2/2016 |

* cited by examiner

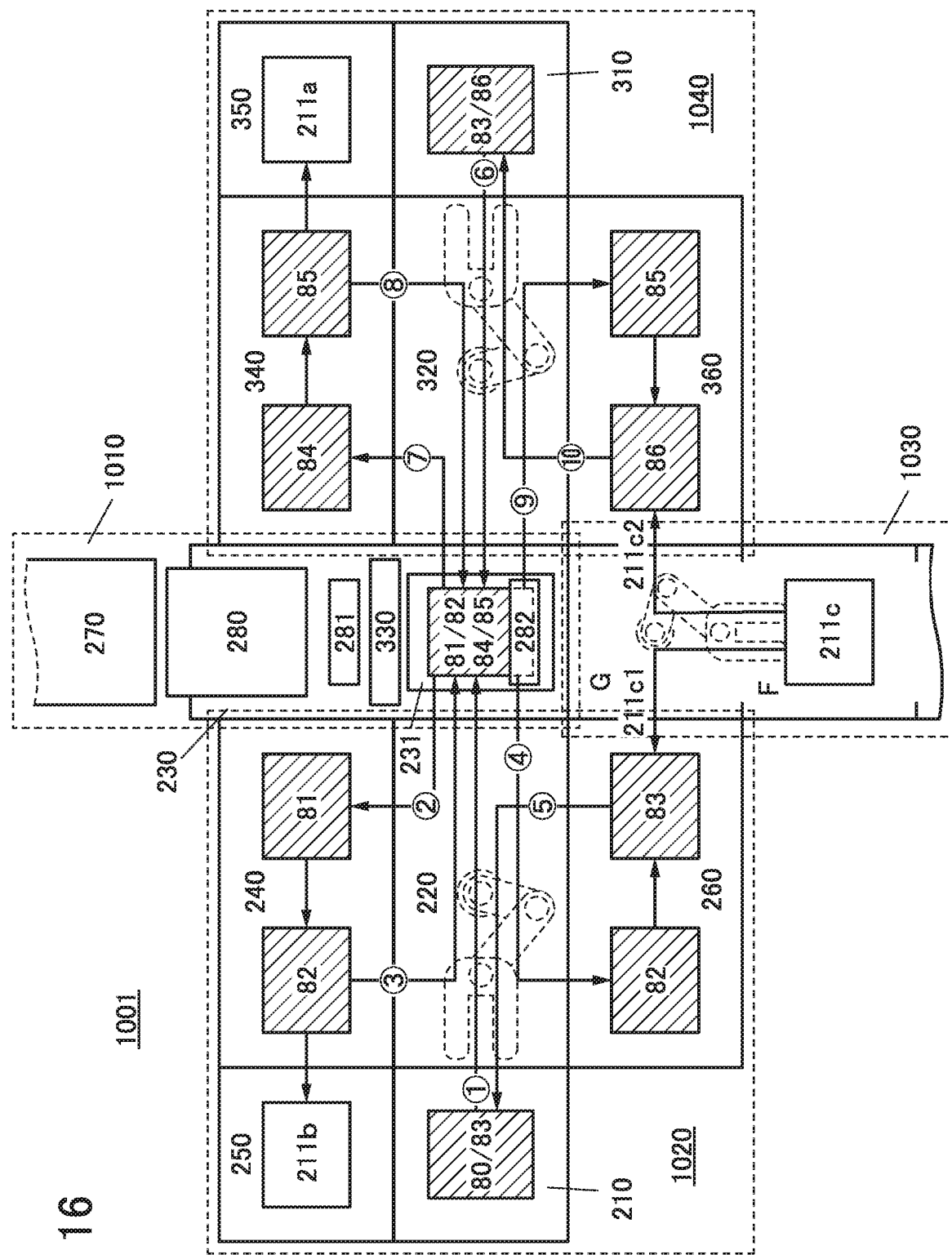

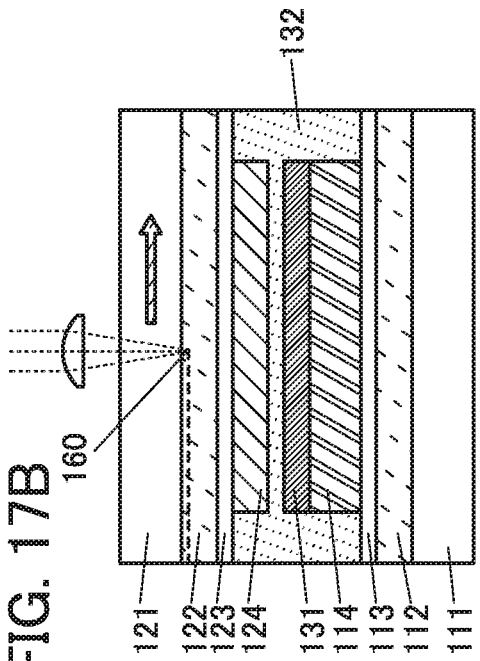
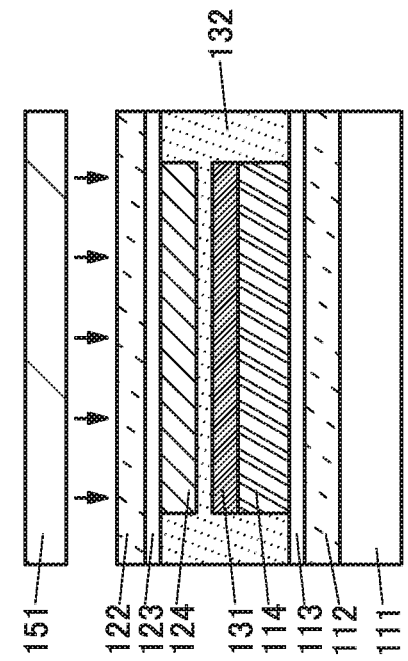
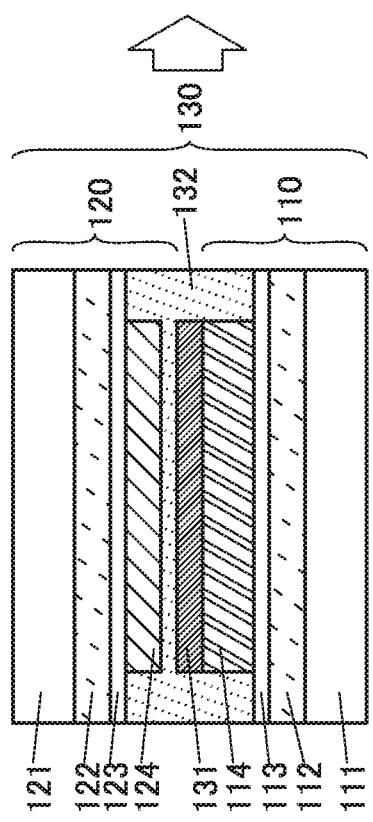
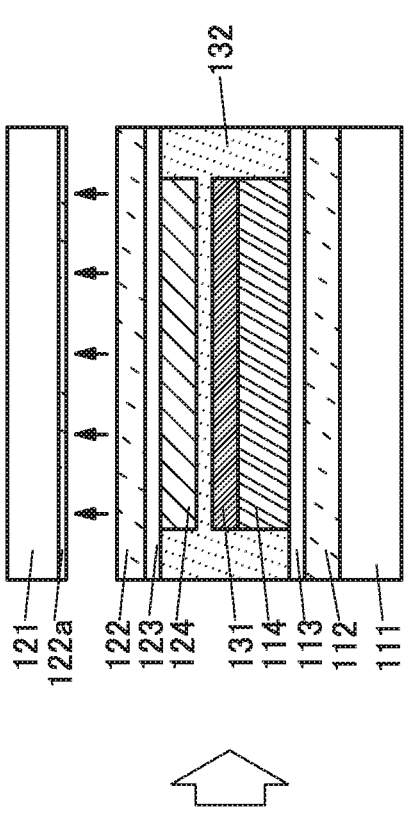

FIG. 21A
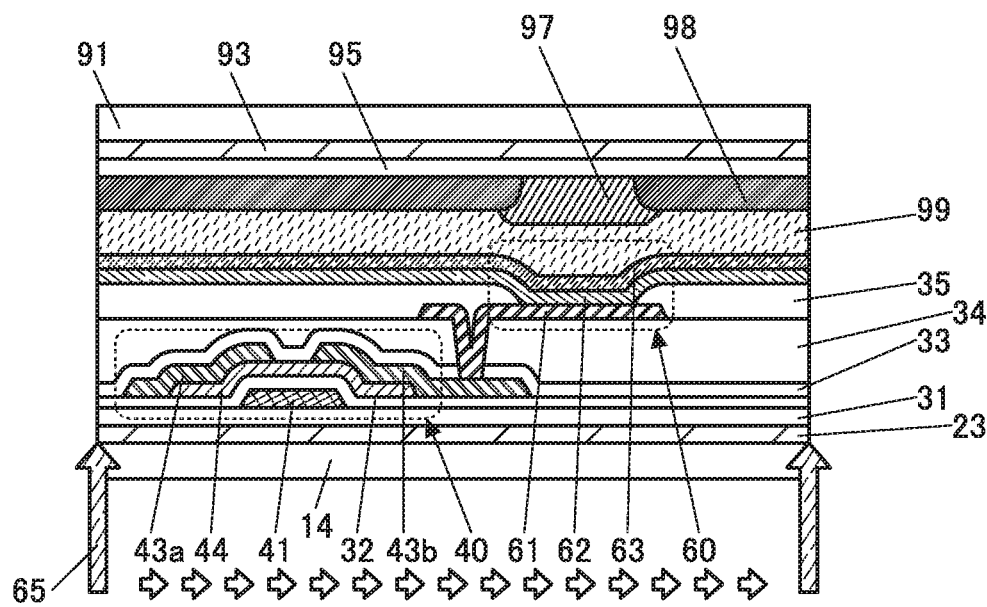
FIG. 21B
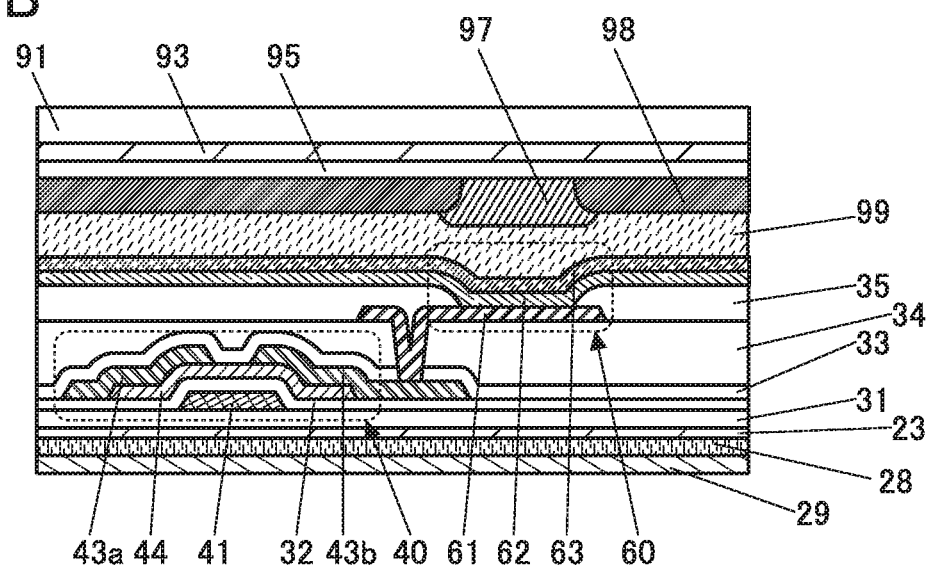

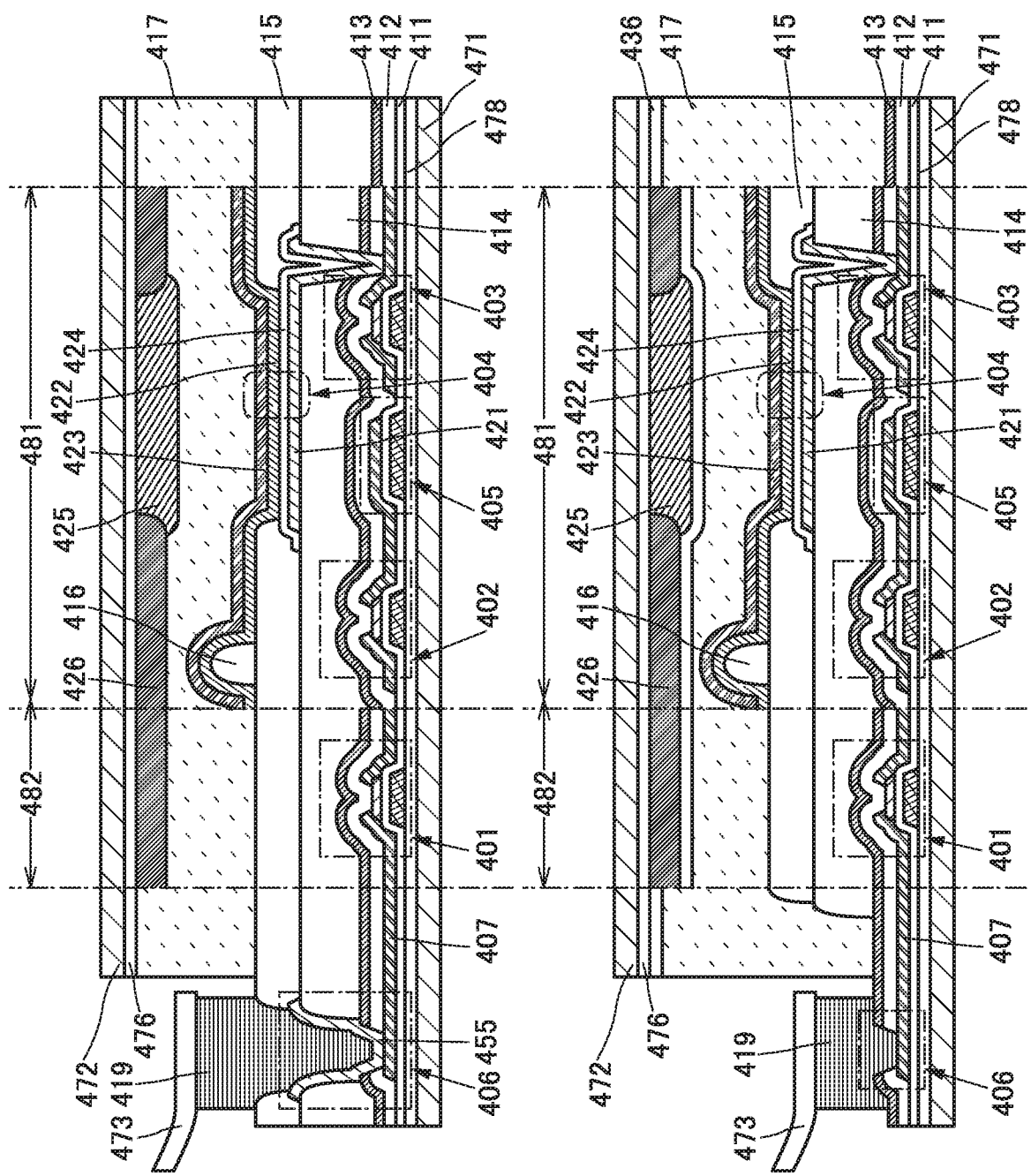

LASER PROCESSING APPARATUS AND STACK PROCESSING APPARATUS

BACKGROUND OF THE INVENTION

1. Field of the Invention

One embodiment of the present invention relates to a laser processing apparatus, a stack processing apparatus, and a method for processing a stack.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device, an input/output device, a method for driving any of them, an apparatus for manufacturing any of them, and a method for manufacturing any of them.

In this specification and the like, a semiconductor device generally means a device that can function by utilizing semiconductor characteristics. A transistor, a semiconductor circuit, an arithmetic device, a memory device, and the like are each an embodiment of the semiconductor device. An imaging device, an electro-optical device, a power generation device (e.g., a thin film solar cell and an organic thin film solar cell), and an electronic appliance each may include a semiconductor device.

2. Description of the Related Art

In recent years, research and development have been extensively conducted on light-emitting elements utilizing electroluminescence (EL). Since the light-emitting element is self-luminous type, a light-emitting device using this light-emitting element has advantages such as high visibility, no necessity of a backlight, low power consumption, and a high response speed.

Furthermore, a light-emitting device provided with the above light-emitting element using a flexible substrate as a support is known as a thin and lightweight light-emitting device. For example, a flexible light-emitting device provided with an organic EL element is disclosed in Patent Document 1.

In addition, a processing apparatus that can be used for manufacturing flexible light-emitting devices and the like is disclosed in Patent Document 2.

REFERENCE

Patent Document

[Patent Document 1] Japanese Published Patent Application No. 2014-197522
[Patent Document 2] Japanese Published Patent Application No. 2015-173088

SUMMARY OF THE INVENTION

Flexible devices typified by flexible displays can be obtained by forming semiconductor elements, such as transistors, and other elements over flexible substrates (films). However, flexible substrates have lower heat resistance than glass substrates or the like. Thus, when transistors or the like are directly formed on flexible substrates, the electrical characteristics and reliability of the transistors cannot be improved in some cases.

Thus, a method described in Patent Document 1 in which a semiconductor element, a light-emitting element, or the like formed over a glass substrate provided with a separation layer is separated and transferred to a flexible substrate has been considered. In this method, the formation temperature of the semiconductor element can be increased; thus, an extremely highly reliable flexible device can be manufactured.

In the case where a resin is used for the separation layer, adhesion between the substrate and the resin is reduced by irradiation with laser light or the like. A laser irradiation apparatus used for this step is provided with a laser oscillator and an optical system and highly expensive. Thus, it is preferable that the laser irradiation apparatus be not only used for one step but also adopted for a plurality of steps.

The separation step significantly affects the material cost, the manufacturing yield, the reliability of products, and the like. Thus, it is preferable to use an apparatus with which the separation step and a process before and after the separation step can be stably performed.

An object is to provide a laser processing apparatus that can switch an optical path. Another object is to provide a laser processing apparatus that can switch a direction of laser irradiation on a flat-plate structure between a direction toward a first surface of the flat-plate structure and a direction toward a surface opposite to the first surface. Another object is to provide a stack processing apparatus with which, in a stack including a first substrate, a second substrate, and a structure sandwiched therebetween, a third substrate is replaced with the first substrate. Another object is to provide a stack processing apparatus with which, in a stack including a first substrate, a second substrate, and a structure sandwiched therebetween, a third substrate and a fourth substrate are replaced with the first substrate and the second substrate, respectively. Another object is to provide a novel stack processing apparatus. Another object is to provide a stack processing apparatus at low cost with high mass productivity. Another object is to provide a method for processing a stack.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to a laser processing apparatus and a stack processing apparatus.

One embodiment of the present invention is a laser processing apparatus including a laser oscillator, an optical system unit, a fixing mechanism of a structure to be processed, a first mirror, a second mirror, a third mirror, a fourth mirror, a first lens, and a second lens. The optical system unit is configured to extend and shape a first laser light emitted from the laser oscillator into a second laser light. The fixing mechanism includes a stage that fixes the structure and a driving mechanism that moves the stage in a horizontal direction. The first mirror is configured to reflect the second laser light to be incident on the first lens. The first lens is configured to condense the second laser light from the first mirror to form a first linear beam. The second mirror is configured to reflect the second laser light to be incident on the third mirror. The third mirror is configured to reflect the second laser light from the second mirror to be incident on the fourth mirror. The fourth mirror is configured to reflect the second laser light from the third mirror to be incident on the second lens. The second lens is configured to condense the second laser light from the fourth mirror to form a second linear beam. The stage is configured to transmit the second laser light through the second lens. A position of the first mirror is changed, whereby the second laser light is incident on the first mirror or the second mirror selectively. The fixing mechanism includes a region overlapping with the optical system unit by a movement in the horizontal direction. The fixing mechanism is moved while the first laser light is emitted from the laser oscillator, whereby a desired region of the structure is irradiated with the first linear beam or the second linear beam.

It is preferable to use a quartz plate for the stage.

The first mirror may be shifted to a position of the second mirror, so that the first mirror is used as the second mirror.

In the above structure, a chamber including a first quartz window and a second quartz window may be provided, and the fixing mechanism, the third mirror, the fourth mirror, and the second lens may be provided inside the chamber. The second laser light transmitted through the first lens may be shaped into a first linear beam through the first quartz window, and the second laser light reflected by the second mirror may be incident on the third mirror through the second quartz window.

In the above structure, a chamber including a first quartz window, a second quartz window, a third quartz window, and a fourth quartz window may be provided, and the fixing mechanism, the third mirror, the fourth mirror, and the second lens may be provided inside the chamber. The second laser light transmitted through the first lens may be shaped into a first linear beam through the first quartz window, the second laser light reflected by the second mirror may be incident on the third mirror through the second quartz window and the third quartz window, and the second laser light transmitted through the second lens may be shaped into a second linear beam through the fourth quartz window.

Another embodiment of the present invention is a stack processing apparatus which processes a first stack in which a first substrate, a first layer, a second layer, a third layer and a second substrate are bonded in this order into a second stack by replacing a third substrate with one of the first substrate and the second substrate. The stack processing apparatus includes a first chamber, a second chamber, a third chamber, a fourth chamber, and a fifth chamber. The first chamber is configured to be a load chamber of the first stack and an unload chamber of the second stack. The second chamber is configured to transfer the first stack, the first stack that is being processed, or the second stack. The third chamber is configured to selectively perform laser irradiation on the first layer through the first substrate or laser irradiation on the third layer through the second substrate. The fourth chamber is configured to separate the first substrate or the second substrate from the first stack. The fifth chamber is configured to bond the third substrate on the exposed first layer or the exposed third layer.

Another embodiment of the present invention is a stack processing apparatus which processes a first stack in which a first substrate, a first layer, a second layer, a third layer, and a second substrate are bonded in this order, into a second stack in which a third substrate, the first layer, the second layer, the third layer, and a fourth substrate are bonded in this order. The stack processing apparatus includes a first chamber, a second chamber, a third chamber, a fourth chamber, a fifth chamber, a sixth chamber, a seventh chamber, an eighth chamber, and a ninth chamber. The first chamber is configured to be a load chamber for the first stack. The second chamber is configured to transfer the first stack or the first stack that is being processed. The third chamber is configured to selectively perform laser irradiation on the first layer through the first substrate or laser irradiation on the third layer through the second substrate. The fourth chamber is configured to separate the first substrate from the first stack. The fifth chamber is configured to bond the third substrate on the exposed first layer. The sixth chamber is configured to transfer the first stack that is being processed or the second stack. The seventh chamber is configured to separate the second substrate from the first stack that is being processed. The eighth chamber is configured to bond the fourth substrate on the exposed third layer to form the second stack. The ninth chamber is configured to be an unload chamber for the second stack.

The first layer and the third layer are preferably formed using a resin.

The third chamber may be provided with a dust collecting mechanism.

Note that in this specification and the like, ordinal numbers such as "first" and "second" are used in order to avoid confusion among components and do not limit the components numerically.

According to one embodiment of the present invention, a laser processing apparatus that can switch an optical path can be provided. Alternatively, a laser processing apparatus that can switch a direction of laser irradiation on a flat-plate structure between a direction toward a first surface of the flat-plate structure and a direction toward a surface opposite to the first surface. Alternatively, a stack processing apparatus with which in a stack including a first substrate, a second substrate, and a structure sandwiched therebetween, a third substrate is replaced with the first substrate. Alternatively, a stack processing apparatus with which in a stack including a first substrate, a second substrate, and a structure sandwiched therebetween, a third substrate and a fourth substrate are replaced with the first substrate and the second substrate, respectively. Alternatively, a novel stack processing apparatus can be provided. Alternatively, a stack processing apparatus at low cost with high mass productivity can be provided. Alternatively, a method for processing a stack can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 16 illustrates a structure of a stack processing apparatus and transfer paths.

FIGS. 17A to 17D illustrate an example of a manufacturing method of a flexible device.

FIGS. 21A and 21B illustrate an example of a manufacturing method of a flexible device.

FIGS. 24A and 24B are cross-sectional views illustrating a display device.

DETAILED DESCRIPTION OF THE INVENTION

Figure 1:
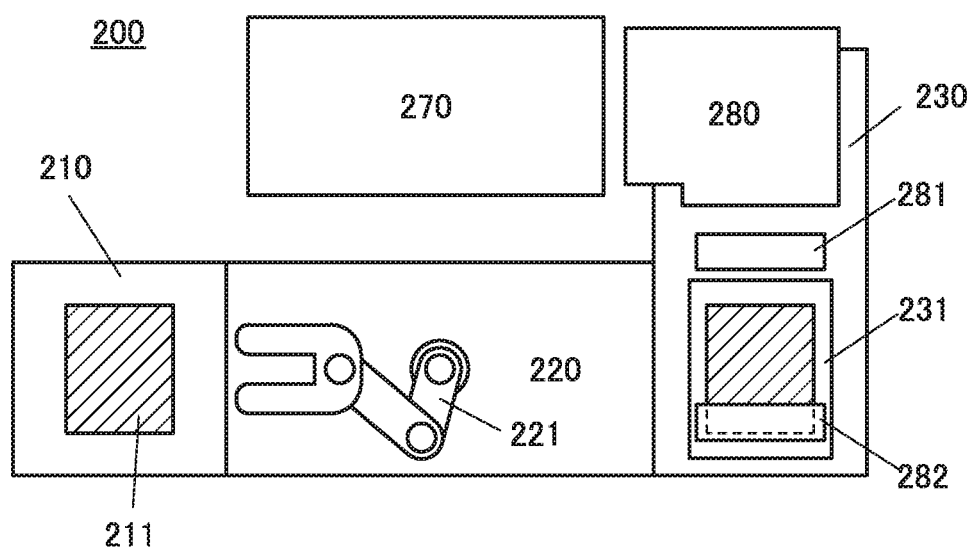
FIG. 1 illustrates a laser processing apparatus.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases.

Embodiment 1

In this embodiment, a laser processing apparatus of one embodiment of the present invention will be described. Note that there is no particular limitation on the usage of the laser processing apparatus. The laser processing apparatus is particularly useful in a manufacturing process of a semiconductor device, a display device, a light-emitting device, a power storage device, a power generation device, or the like that includes a flexible substrate.

One embodiment of the present invention is a laser processing apparatus which enables steps to be performed selectively by switching of optical paths. The steps are a step in which a first surface of a flat-plate structure, for example, is irradiated with a laser and a step in which a surface opposite to the first surface of the structure is irradiated with the laser.

With this function, laser irradiation on different surfaces of a structure can be conducted even when the structure cannot be turned over due to the structural strength. In addition, the damage caused by turnover and fixing of the structure can be prevented. Furthermore, a mechanism for turning over the structure is not needed. Furthermore, one laser oscillator, one optical system unit, and the like can be shared for laser irradiation in different directions; thus, the laser processing apparatus can be formed at a low cost.

The laser light is a linear laser whose shape on the irradiated surface is substantially a rectangle. The structure is irradiated with the laser light while being moved in the horizontal direction, whereby a desired region on the first surface of the structure or the opposite surface can be wholly processed.

For example, a structure in which a resin is sandwiched between two substrates can be irradiated with laser light in such a manner that the resin is irradiated with the laser light transmitted through one of the substrates, and the one of the substrate is separated.

Note that in one embodiment of the present invention, the following case is not expected: the first surface of the structure and the opposite surface are concurrently irradiated with laser light. Thus, a total reflection mirror with high reflectivity is preferably used for switching an optical path. The reflectivity of the mirror is higher than or equal to 90% with respect to a specific wavelength of used laser light, preferably higher than or equal to 95%, further preferably higher than or equal to 98%. A mirror that transmits a large amount of light, such as a half mirror, is not suitable for the mirror.

FIG. 1 is a top view illustrating a laser processing apparatus 200 of one embodiment of the present invention. The laser processing apparatus 200 can include a load/unload chamber 210, a transfer chamber 220, a laser processing chamber 230, an optical system unit 280, a laser oscillator 270, and the like.

The load/unload chamber 210 can be provided with a cassette in which a structure 211 that is to be processed is located. The structure 211 is transferred from the cassette, and the processed structure 211 is transferred thereinto. Note that two cassettes may be provided so that the structure 211 that has not been processed can be transferred from one of the cassettes and the processed structure 211 can be transferred into the other cassette. Alternatively, the load chamber and the unload chamber may be separately provided.

The transfer chamber 220 includes a transfer mechanism 221 with which the structure 211 is transferred into/from the load/unload chamber 210 or the laser processing chamber 230. As the transfer mechanism 221, an arm-type robot with a fork that supports one of surfaces of the structure 211 can be used, for example.

The laser oscillator 270 preferably outputs light with a wavelength and intensity suitable for the purpose of processing. Typically, a pulsed laser is preferable, or a CW laser can be used. For example, in the case where the resin is irradiated on the substrate side with laser light so that part of the resin is embrittled, a laser oscillator that emits light whose transmittance with respect to the substrate and absorbance with respect to the resin are high is preferably selected. In this case, an excimer laser with a wavelength ranging from 351 nm to 353 nm (XeF), a wavelength of 308 nm (XeCl), or the like can be used, typically. Alternatively, a second harmonic wavelength (515 nm, 532 nm, or the like) or a third harmonic wavelength (343 nm, 355 nm, or the like) of a solid-state laser such as a YAG laser or a fiber laser may be used. A plurality of laser oscillators 270 may be provided.

The optical system unit 280 includes a mirror, a beam expander, a beam homogenizer, or the like, for example, and homogenizes and expands the energy in-plane distribution of laser light emitted from the laser oscillator 270. In this embodiment, a beam shape on the surface of the structure to be processed is a linear shape, and thus the laser light emitted from the optical system unit 280 is preferably shaped into a rectangle.

Figure 2A:
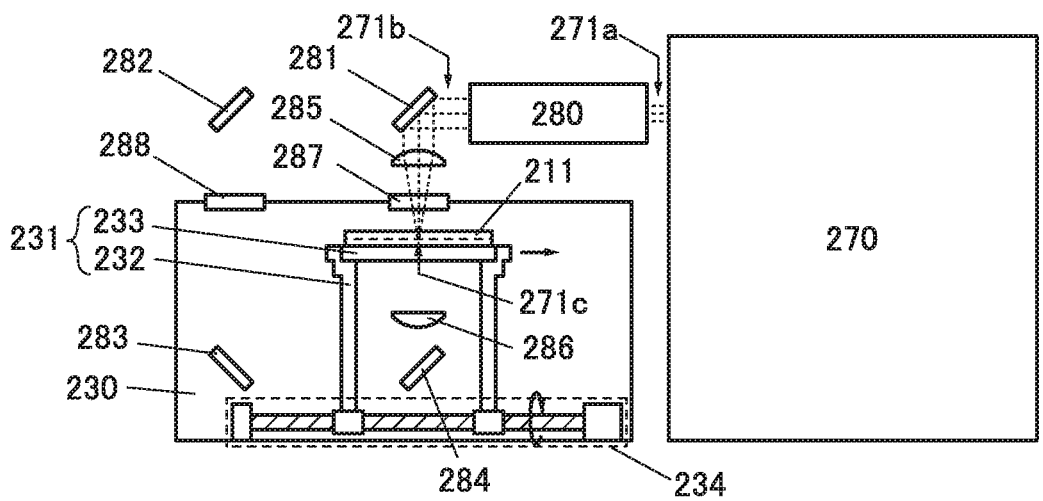
FIGS. 2A to 2D illustrate a laser processing apparatus.

FIG. 2A is a side view illustrating the laser oscillator 270, the optical system unit 280, an inside of the laser processing chamber 230, and the other optical components.

The laser processing chamber 230 includes a fixing mechanism 231 of the structure 211. The fixing mechanism 231 can be moved in the horizontal direction with use of a horizontal moving mechanism 234. For the horizontal moving mechanism 234, for example, a ball screw mechanism that drives with a motor, or the like can be used. The ball screw mechanism and a spindle 232 of the fixing mechanism 231 can be connected with a nut having a bearing.

A mirror 281, a mirror 282, and a lens 285 are provided outside the laser processing chamber 230. A mirror 283, a mirror 284, and a lens 286 are provided inside the laser processing chamber 230. Quartz windows 287 and 288 are provided above the laser processing chamber 230. For each of the mirrors 281 to 284, for example, a dielectric multi-layer mirror can be used. For each of the lenses 285 and 286, for example, a cylindrical lens can be used. The mirrors 281 to 284 are provided so that the incident angle of laser light becomes approximately 45°.

Although FIG. 2A illustrates a mode in which a chamber is provided as the laser processing chamber 230, a structure without the chamber is possible. In such a case, the quartz windows 287 and 288 are not needed.

Figure 3:
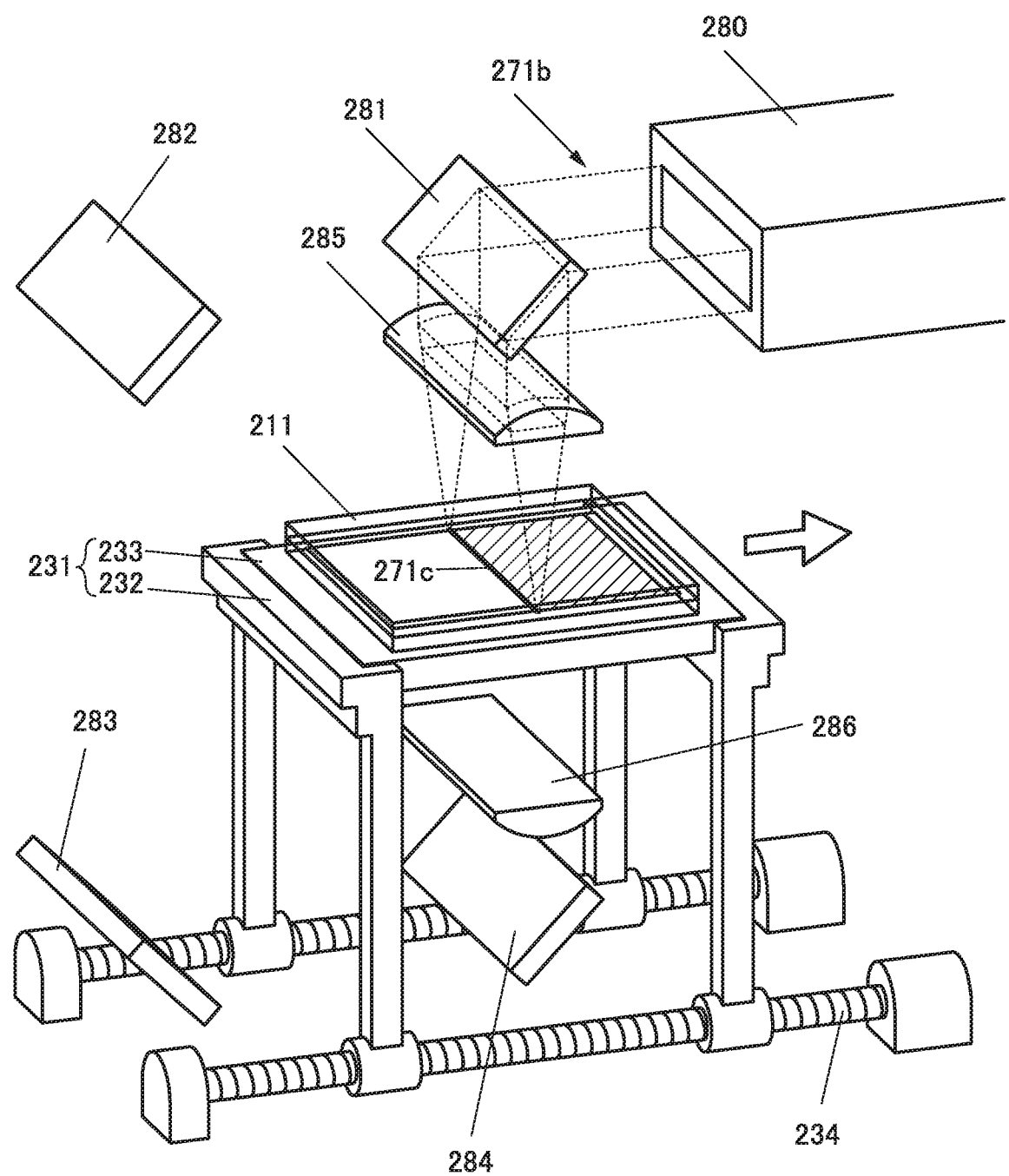
FIG. 3 illustrates a laser processing apparatus.

The laser processing apparatus 200 of one embodiment of the present invention enables the optical path to be switched by moving the mirror 281. Laser irradiation on the top surface of the structure 211 located on a stage 233 of the fixing mechanism 231 is described with reference to FIG. 2A and FIG. 3. Note that in FIG. 3, the chamber and the quartz windows 287 and 288 are not illustrated.

First, laser light 271a emitted from the laser oscillator 270 is extended and shaped into laser light 271b that is a rectangle by the optical system unit 280, and then the laser light 271b is incident on the mirror 281. At this time, the laser light 271b may be divided into a plurality of laser beams. Although the laser light 271b emitted from the optical system unit is illustrated as parallel light in FIG. 3, the laser light 271b may expand toward the incident surface.

The laser light 271b reflected by the mirror 281 enters the lens 285, passed through the quartz window 287, and be condensed, whereby a linear beam 271c is formed at a desired position on the structure 211. The fixing mechanism 231 is moved in the horizontal direction in a state where the structure 211 is irradiated with the linear beam 271c, whereby a desired region on the structure 211 can be subjected to laser processing.

Figure 2B:
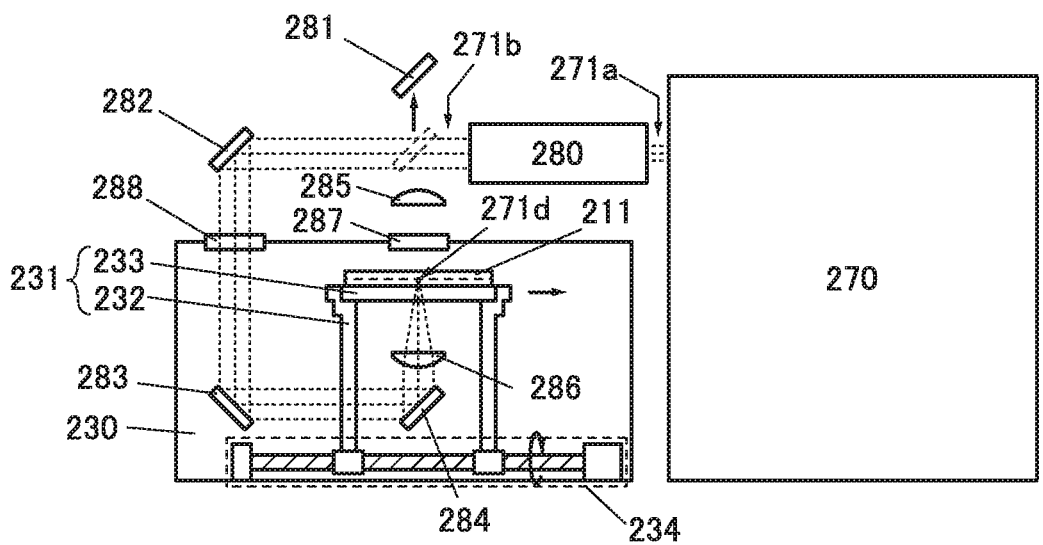
Figure 4:
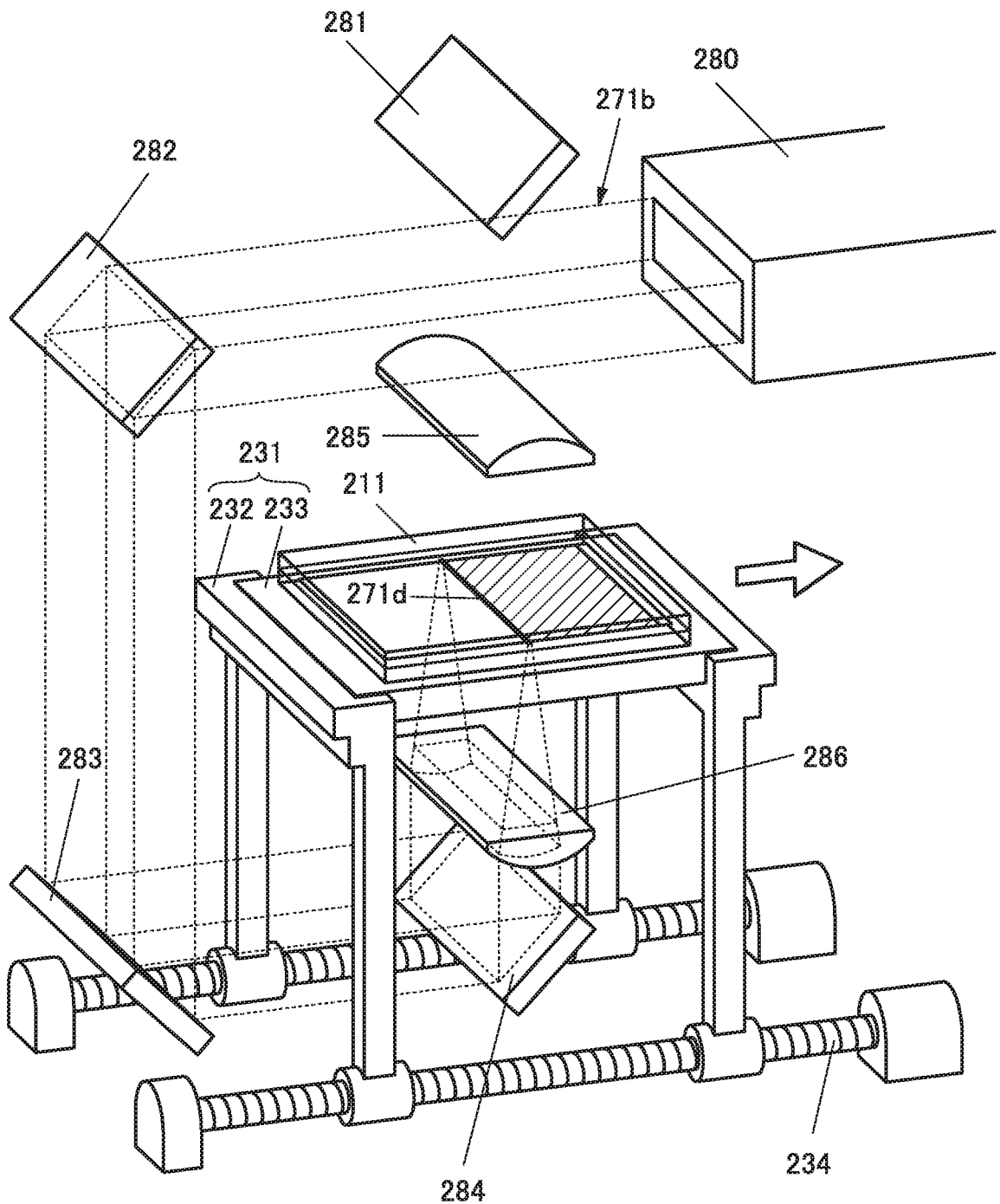
FIG. 4 illustrates a laser processing apparatus.

Next, laser irradiation on a bottom surface of the structure 211 located on the stage 233 of the fixing mechanism 231 is described with reference to FIG. 2B and FIG. 4. In FIG. 4, the quartz windows 287 and 288 are not shown.

Figure 2C:
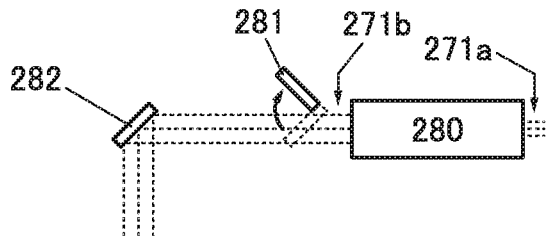
Figure 2D:
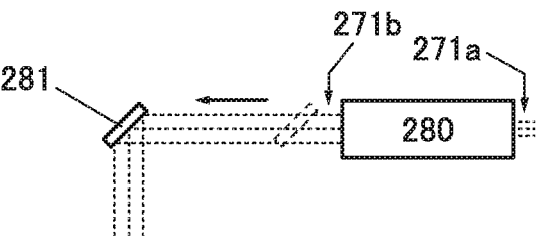

First, the mirror 281 is moved to a portion where the laser light 271b emitted from the optical system unit 280 is not incident. For example, as shown in FIG. 2B and FIG. 4, the mirror 281 is moved above a predetermined position to deviate from the optical path. Alternatively, the mirror 281 may be rotated around one end of the mirror 281 to deviate from the optical path, as shown in FIG. 2C. Further alternatively, the mirror 281 may be moved to a predetermined position of the mirror 282 to serve as the mirror 282. In this case, the mirror 282 at the predetermined position is not necessarily provided. Although not illustrated, a transfer mechanism which can move the mirror 281 back to the predetermined position with high accuracy is preferably provided. For example, a slide mechanism or a rotation mechanism using a stepping motor may be used.

The laser light 271a emitted from the laser oscillator 270 is extended and shaped into the rectangular laser light 271b through the optical system unit 280, and the laser light 271b is incident on the mirror 282.

The laser light 271b reflected by the mirror 282 is incident on the mirror 283 through the quartz window 288. The laser light 271b reflected by the mirror 283 is incident on the mirror 284.

The laser light 271b reflected by the mirror 284 is incident on the lens 286 and is condensed through the stage 233, so that a linear beam 271d is formed at a desired portion on the structure 211. The fixing mechanism 231 is moved in the horizontal direction in the state where the structure 211 is irradiated with the linear beam 271d, whereby a desired region on the structure 211 can be processed by the laser.

The stage 233 is preferably a quartz plate with high transmittance even to ultraviolet light. Note that when the linear beam 271d has a sufficiently high energy density needed to process the structure 211, a glass plate may be used as the stage 233. Furthermore, to irradiate the desired processing region on the structure 211 with the linear beam 271d, the stage 233 may have an opening. In this case, the stage 233 may be formed using a material through which laser light is not transmitted, such as a metal or ceramics.

The structure 211 can be fixed with a vacuum suction mechanism provided for the stage 233 though the mechanism is not shown in the drawing. In delivering the structure 211, the structure 211 can be moved up and down with a pusher pin.

Figure 5A:
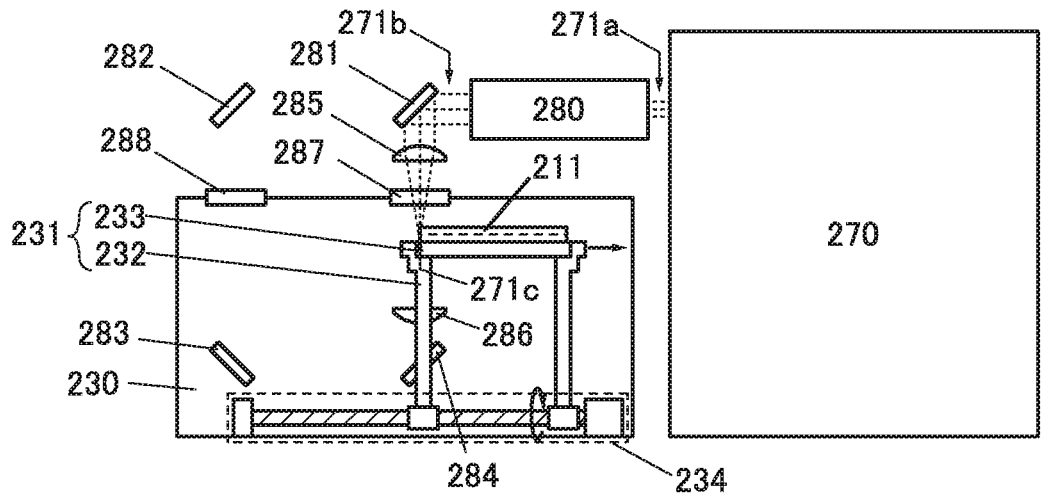
FIGS. 5A to 5C illustrate a laser processing apparatus.

When the laser processing is performed up to an edge of the structure 211 as shown in FIG. 5A, it is preferable that the optical system unit 280 and the fixing mechanism 231 overlap with each other. With such a structure, a footprint of the whole of the laser processing apparatus can be made small.

To obtain such a structure, as illustrated in FIG. 1, FIGS. 2A to 2D, FIG. 3, FIG. 4, and FIGS. 5A to 5C, the mirror 282 is preferably positioned farther than the mirror 281 is when the optical system unit 280 is regarded as a starting point, and the optical path is switched by moving the mirror 281. It is possible to switch the optical path by moving the mirror 282 when the mirror 282 is positioned closer to the optical system unit 280 than the mirror 281 is. However, in this case, the optical path is blocked when the fixing mechanism 231 is moved to a portion overlapping with the optical system unit 280. To overcome this problem, the footprint has to be increased so as to avoid the fixing mechanism 231 from overlapping with the optical system unit 280.

Figure 5B:
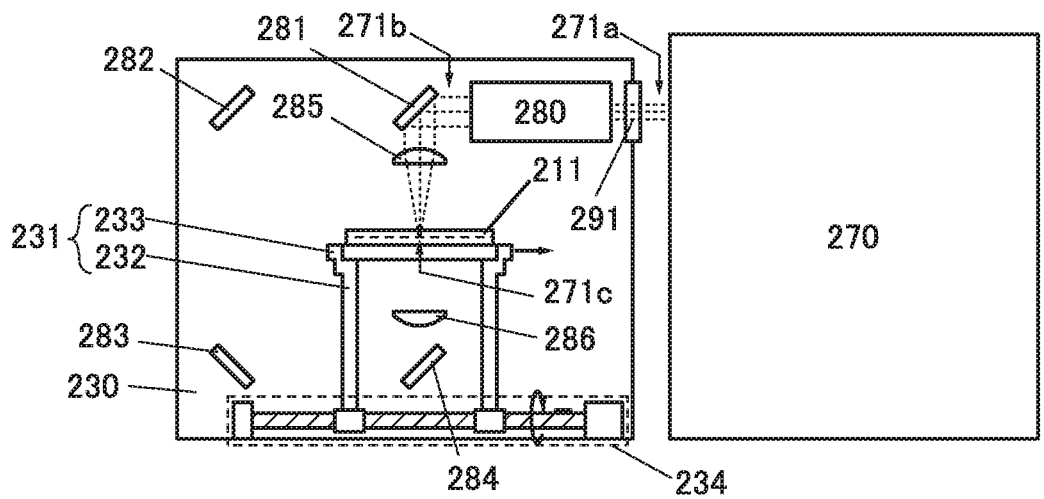

The chamber of the laser processing chamber 230 can employ a mode illustrated in FIG. 2A or is not necessarily provided. Alternatively, a mode in which all components other than the laser oscillator 270 are provided inside the chamber, as illustrated in FIG. 5B, may be employed. The atmosphere in the chamber is controlled in such a structure, whereby deterioration of the optical components such as the mirror or the lens can be prevented. In a path through which the laser light 271a enters the chamber, a quartz window 291 is necessary. In this case, the quartz windows 287 and 288 are not needed.

Figure 5C:
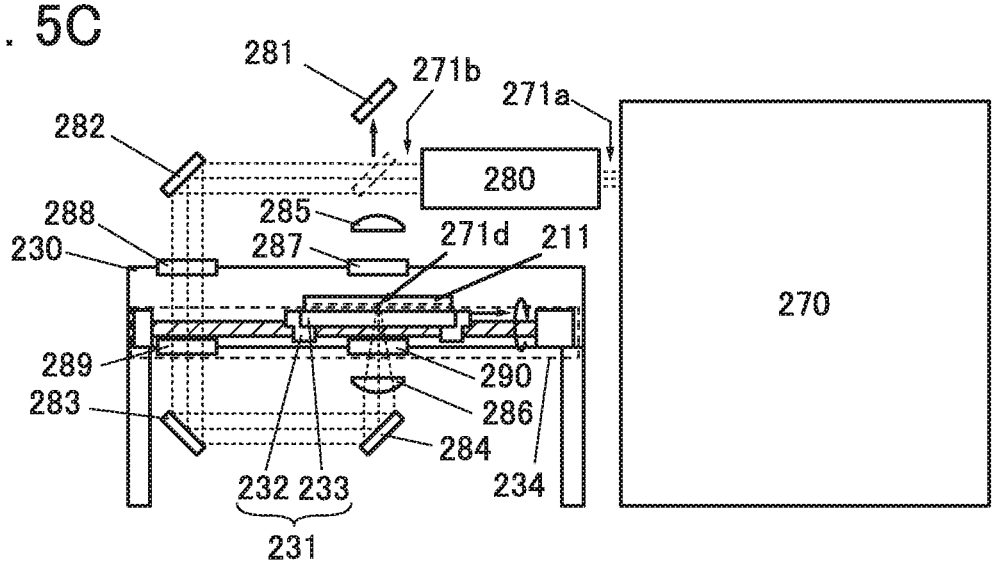

Alternatively, as illustrated in FIG. 5C, a structure in which the mirrors 281 to 284 and the lenses 285 and 286 are provided outside the chamber of the laser processing chamber 230 may be employed. In this case, the quartz windows 289 and 290 are necessarily provided, which facilitates maintenance such as adjusting the optical path.

Note that a glass window can be replaced with part or the whole of the quartz windows 288 to 291 on the assumption that the linear beams 271c and 271d can have the required energy density.

Figure 6A:
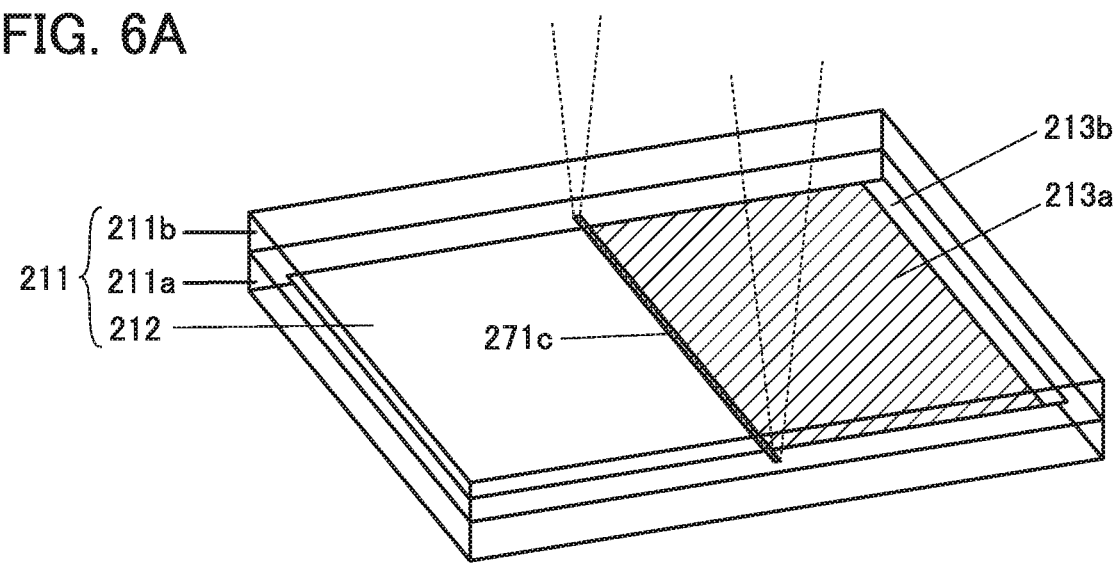
FIGS. 6A to 6C illustrate a structure and laser processing.
Figure 6B:
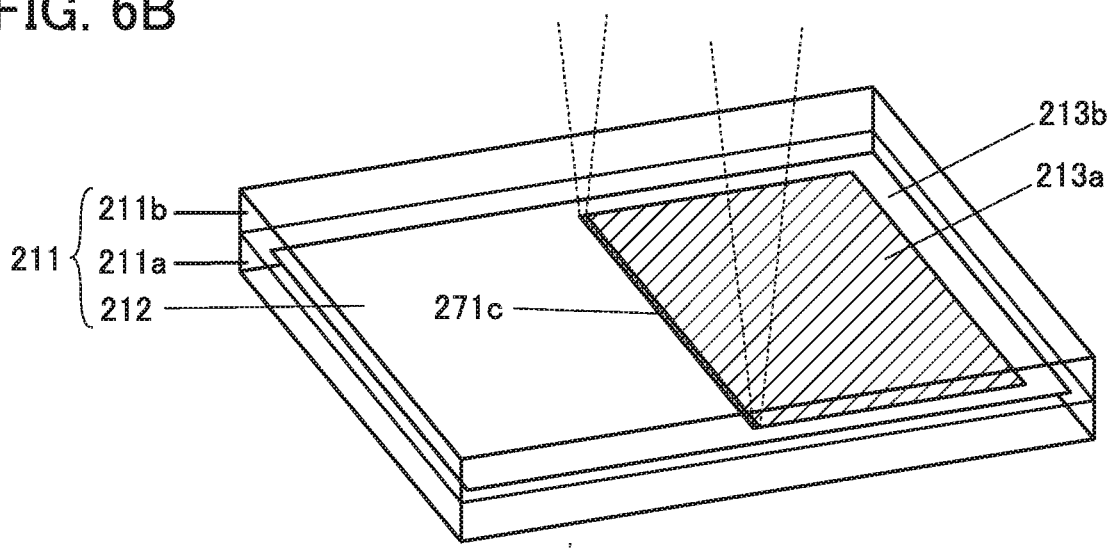
Figure 6C:
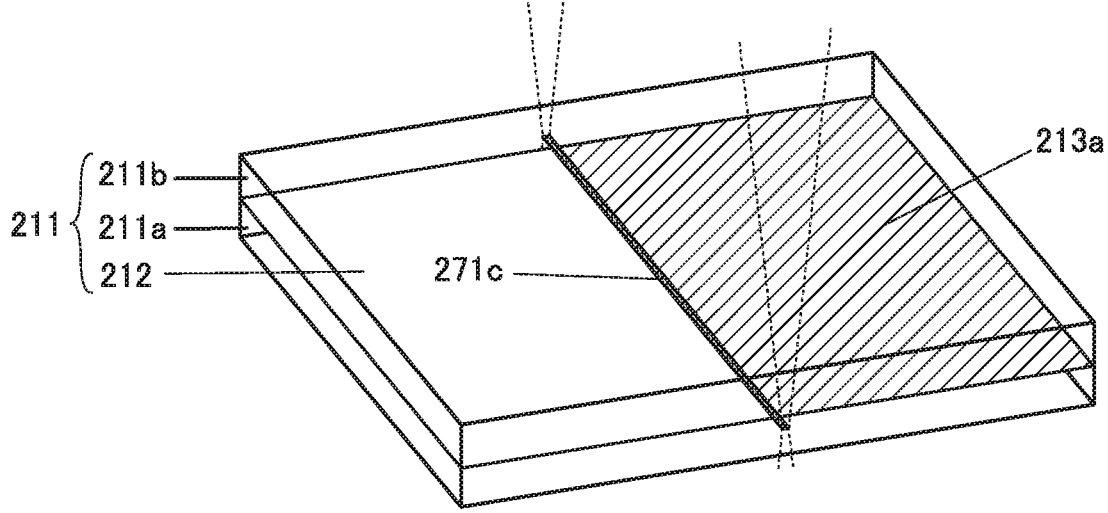

With FIGS. 6A to 6C, a relation between the linear beams 271c and 271d and the structure 211 that is to be processed is described. Although in FIGS. 6A to 6C, the linear beam 271c is described as an example, the similar description can be referred to for the linear beam 271d.

The structure 211 includes a substrate 211a, a substrate 211b, and a layer 212 sandwiched between the two substrates. The substrate 211a and the substrate 211b are each a glass substrate or the like. A material of each substrate allows the linear beams 271c and 271d to have the required energy density even when the laser is transmitted through the substrate. The layer 212 includes a resin layer, for example. By irradiation with the linear beams 271c and 271d with a given intensity or higher, the resin layer can be processed. Top surface shapes of the substrate 211a, the substrate 211b, and the layer 212 are each a rectangle.

FIG. 6A illustrates a state in which the layer 212 provided between the substrate 211a and the substrate 211b is irradiated with the linear beam 271c that is longer than the short side of the layer 212, whereby a processing region 213a is provided.

In this case, the short-side direction of the layer 212 can be wholly processed. The long-side direction of the layer 212 can also be wholly processed; meanwhile, when the starting position of irradiation with the linear beam 271c is adjusted, a region 213b that is not processed can be provided as illustrated in FIG. 6A.

FIG. 6B illustrates a state in which the layer 212 provided between the substrate 211a and the substrate 211b is irradiated with the linear beam 271c that is shorter than the short side of the layer 212, whereby the processing region 213a is provided.

In this case, a region that is not to be processed is generated in the short-side direction of the layer 212. The long-side direction of the layer 212 can be wholly processed except for the edge of the short side; meanwhile, when the starting position of irradiation with the linear beam 271c is adjusted, the region 213b that is not processed can be provided as illustrated in FIG. 6B. Note that in the case where the short-side direction is wholly subjected to irradiation, a moving mechanism may be additionally provided to move the structure 211 so that the linear beam 271c can be incident thereon.

FIG. 6C illustrates a state in which the layer 212 with the same size as surfaces of the substrates 211a and 211b is irradiated with the linear beam 271c that is longer than the short sides of the substrate 211a and the substrate 211b, whereby the processing region 213a is provided.

In this case, the layer 212 can be wholly processed. Furthermore, a region that is not processed can be provided in the long-side direction of the layer 212 when the starting position of irradiation with the linear beam 271c is adjusted.

As described above, the sizes of the substrate 211a and the substrate 211b, the length of the linear beam 271c, and a size of the region where the layer 212 is formed are selected as appropriate, whereby a desired region of the layer 212 can be processed.

With reference to FIG. 1, FIGS. 2A to 2D, FIG. 3, FIG. 4, and FIGS. 5A to 5C, the structure in which linear beam irradiation is performed on the first surface of the structure 211 or the opposite surface by switching the optical path of laser light is described; however, the irradiation with laser light may be performed while the structure 211 is turned over if the structure 211 is not adversary affected.

Figure 7A:
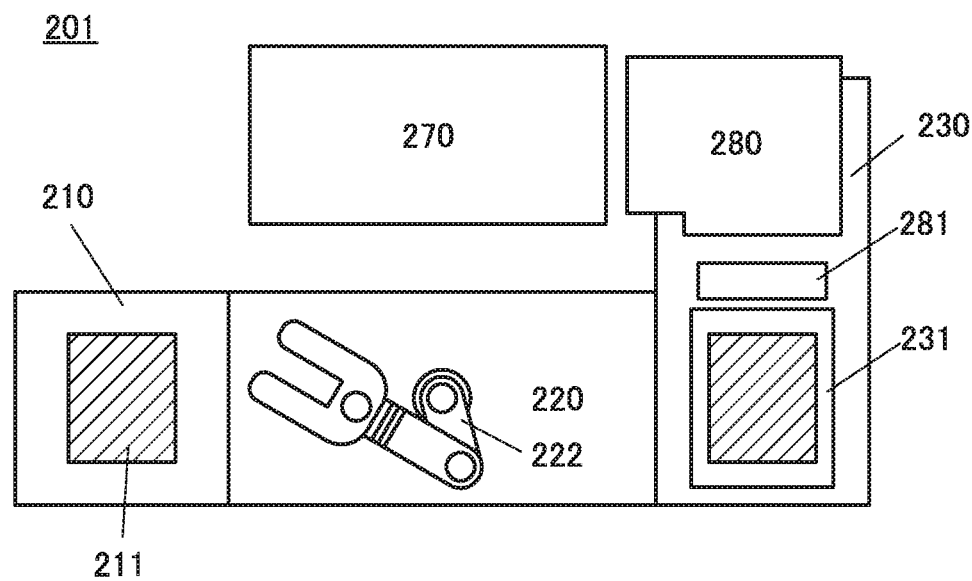
FIGS. 7A and 7B illustrate a laser processing apparatus.
Figure 7B:
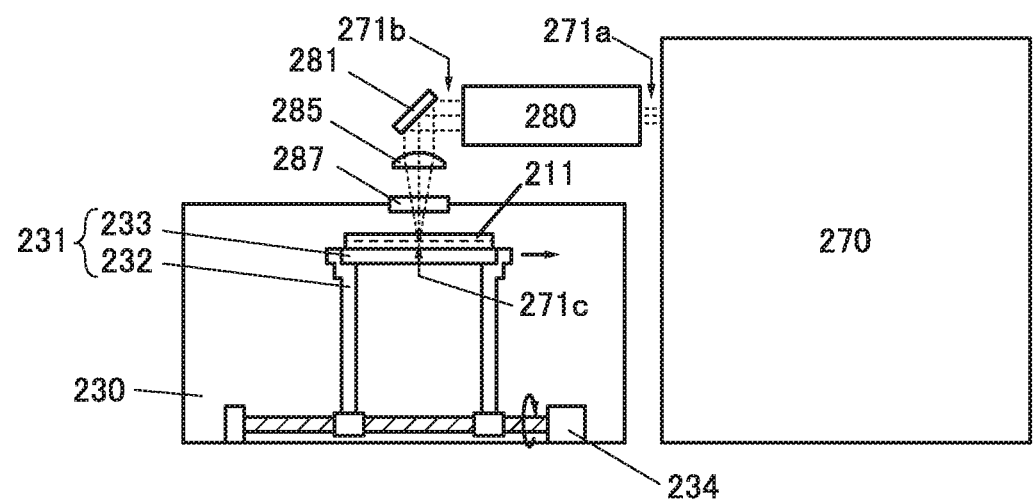

FIG. 7A is a top view of a laser processing apparatus 201 in which the structure 211 can be turned over. FIG. 7B is a side view illustrating the laser oscillator 270, the optical system unit 280, an inside of the laser processing chamber 230, and other optical components.

The laser processing apparatus 201 basically has a structure similar to that of the laser processing apparatus 200; however, a transfer mechanism 222 provided in the transfer chamber 220 has a function of turning over the structure 211.

FIGS. 8A to 8D illustrate the transfer mechanism 222 and an operation of turning over the structure 211. Note that in the structure 211, the layer 212 described above is not illustrated.

The transfer mechanism 222 is an arm-type robot and includes an elevating (up and down) mechanism 229, joint mechanisms 223a, 223b, and 223c, arms 227 and 228, a turnover mechanism 224, a fork 225, and the like. The structure 211 can be transferred by a telescopic operation of the arms 227 and 228 and an up and down operation of the elevating mechanism 229 using the joint mechanisms 223a and 223b as axes.

Figure 8A:
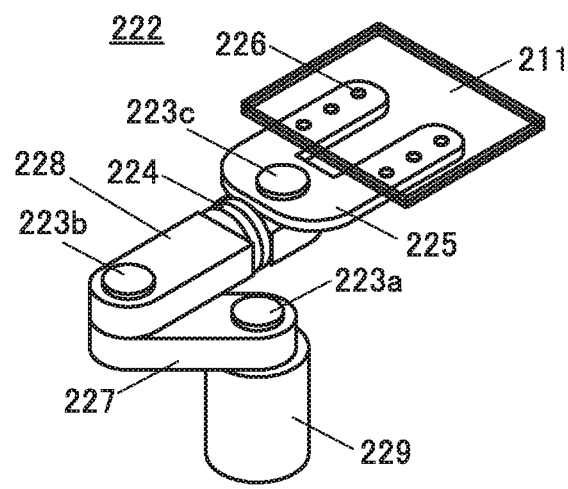
FIGS. 8A to 8D illustrate a transfer mechanism.
Figure 8B:
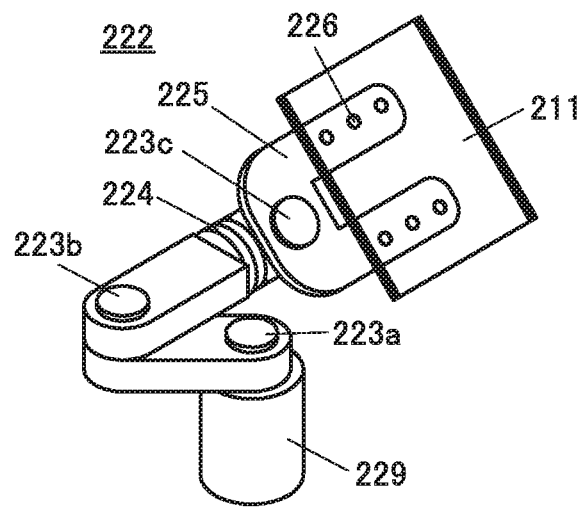
Figure 8C:
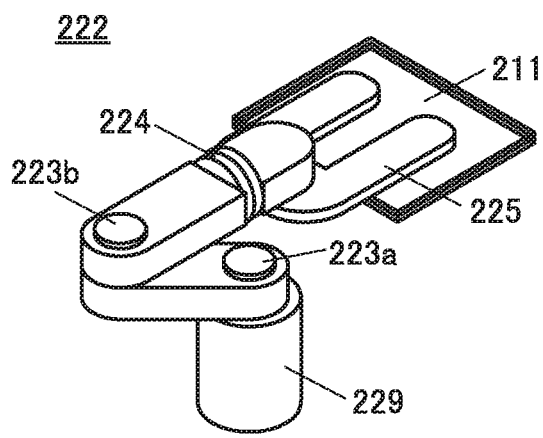
Figure 8D:
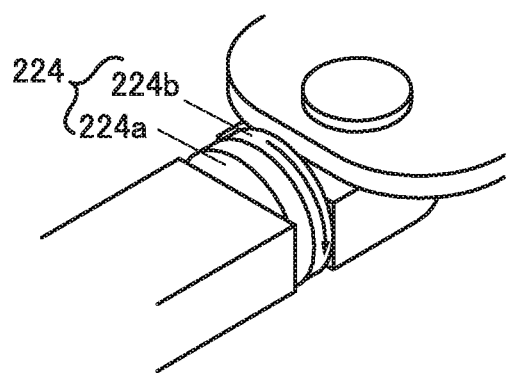

The turnover mechanism 224 includes a support part 224a and a rotating part 224b as illustrated in FIG. 8D. When the rotating part 224b is rotated, the fork 225 can also be rotated.

The structure 211 is supported by the fork 225 with an suction mechanism 226. Thus, as illustrated in FIGS. 8B and 8C, the structure 211 can be supported even when the fork 225 is inclined or turned over. Note that as the suction mechanism 226, a vacuum suction mechanism can be used, for example. Furthermore, the suction mechanism 226 may have a sucker.

In the case where the structure 211 can be turned over with the transfer mechanism 222, the laser irradiation in only one direction is needed. Thus, the mirror and the lens used for laser irradiation from the stage 233 side, as illustrated in FIG. 7B, are not needed.

As described above, with use of the laser processing apparatus of one embodiment of the present invention, laser irradiation can be performed readily on a first surface side of a flat-plate structure and a surface side opposite to the first surface side.

Note that this embodiment can be combined with any of the other embodiments in this specification as appropriate.

Embodiment 2

In this embodiment, description is given of a stack processing apparatus including the laser processing apparatus in Embodiment 1 that is one embodiment of the present invention.

Figure 9A:
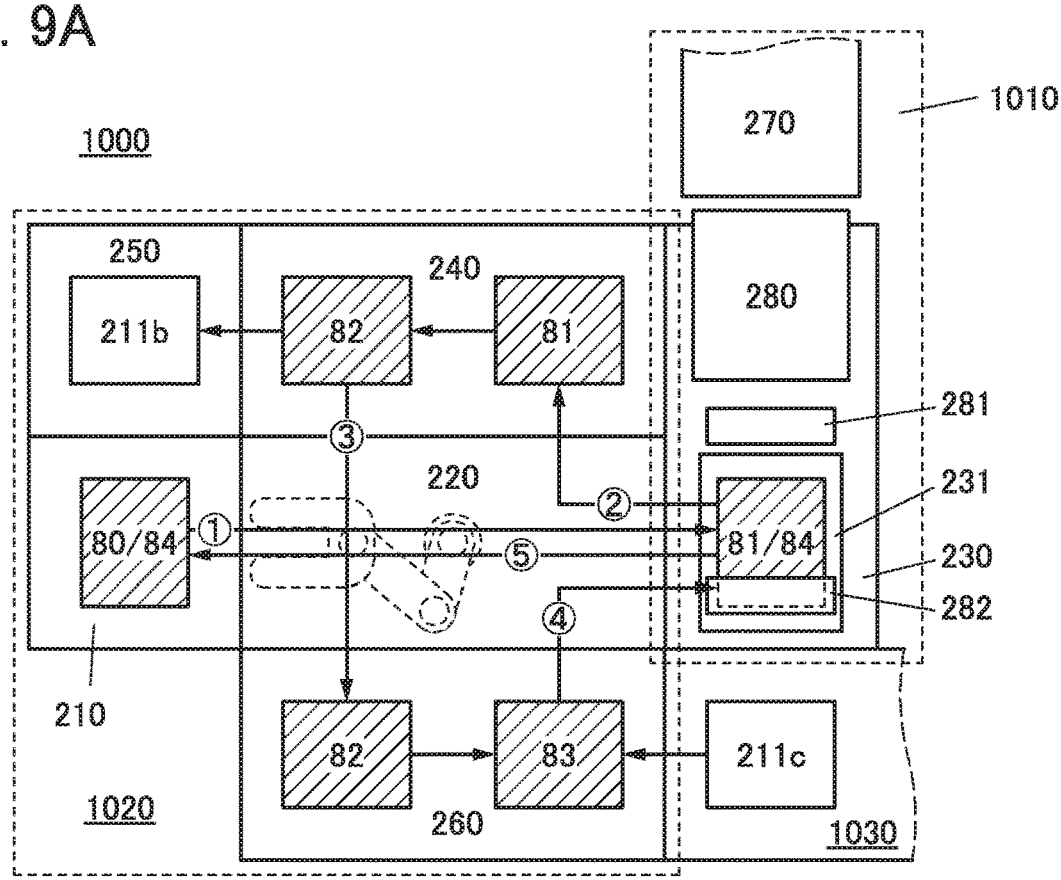
FIGS. 9A and 9B illustrate a stack processing apparatus.

FIG. 9A is a schematic diagram illustrating a structure of a stack processing apparatus 1000 that is one embodiment of the present invention, and path of transferring stacks 80 to 84. Here, the stack 80 indicates the structure 211 illustrated in FIGS. 6A to 6C and the like, which has not been irradiated with laser light. The stack 84 indicates the stack that has been processed. The stacks 81 to 83 indicate the stacks in the middle of the processing.

With the stack processing apparatus 1000 described in this embodiment, a step of replacing a substrate 211c with the substrate 211b included in the stack 80 can be performed. In addition, a step of separating the substrate 211a can be performed.

The processing apparatus 1000 includes a first unit 1010, a second unit 1020, and a third unit 1030. The first unit 1010 includes the components (such as the laser oscillator 270, the optical system unit 280, the laser processing chamber 230, and other optical components) for laser irradiation of the laser processing apparatus 200 illustrated in FIG. 1. The second unit 1020 includes the components (such as the load/unload chamber 210 and transfer chamber 220) for the substrate transfer of the laser processing apparatus 200, a first processing chamber 240, a second processing chamber 260, and a substrate collection chamber 250.

Figure 10A:
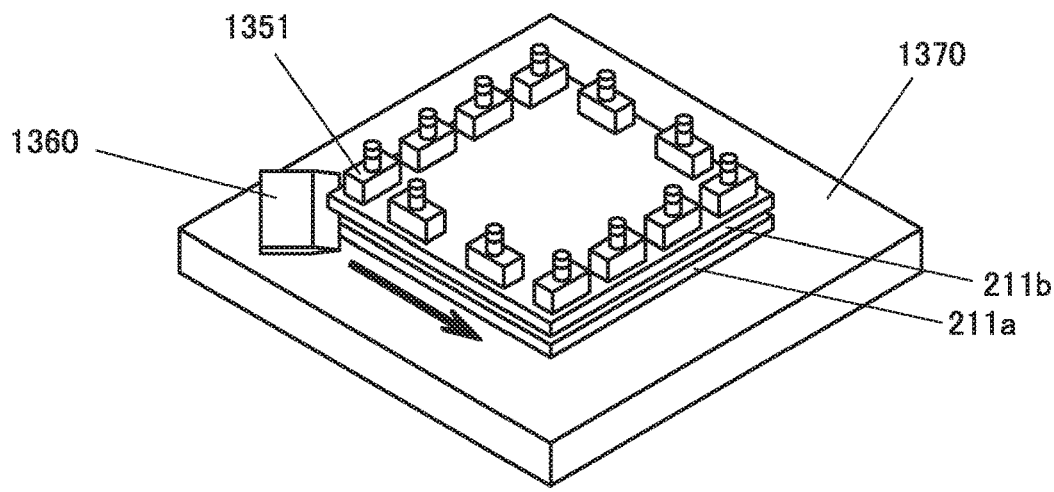
FIGS. 10A to 10C illustrate a separation step performed with a stack processing apparatus.

In the first processing chamber 240, a process in which the substrate 211b is separated from the stack 80 can be performed. For the process, for example, a plurality of suction mechanisms 1351 as illustrated in FIG. 10A can be used. A vacuum suction mechanism and an elevating mechanism are connected to the suction mechanism 1351. Such mechanisms are attached on the vicinity of edge of the substrate 211b, and the substrate 211b is lifted. In this manner, separation is performed. In addition, the substrate 211a of the stack 80 can be fixed on the stage 1370 with the vacuum suction mechanism or the like.

Figure 10B:
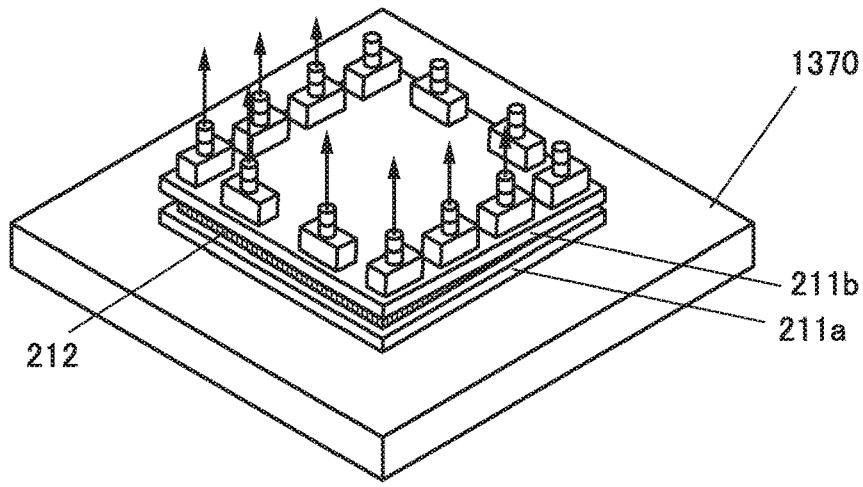
Figure 10C:
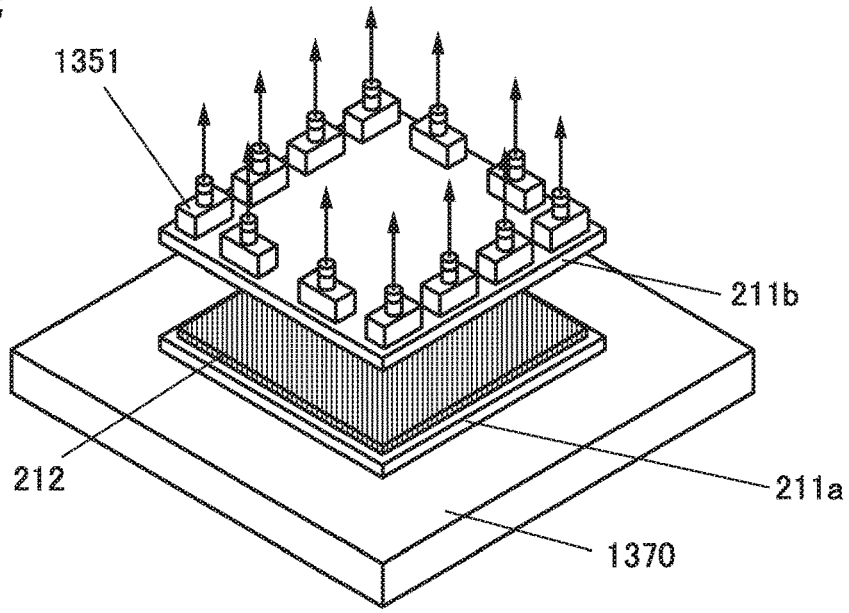

Note that separation of the substrate 211b from the stack 80 is performed under the condition where adhesion between the substrate 211b and the layer 212 is reduced by laser processing performed on the layer 212. Thus, in the case where the layer 212 has a region that is not subjected to laser irradiation as illustrated in FIGS. 6A and 6B, the region that is not irradiated with a laser is cut off with use of a knife-like jig 1360 or the like, as illustrated in FIG. 10A. Then, the suction mechanisms 1351 are lifted sequentially as illustrated in FIGS. 10B and 10C, whereby the substrate 211b is separated. In the case where the whole of the layer 212 can be processed as illustrated in FIG. 6C, a step with the jig 1360 is not needed.

The first processing chamber 240 may be provided with a cleaning mechanism.

The substrate collection chamber 250 has a function of collecting the substrate 211a separated from the stack 80. Note that first processing chamber 240 may have the function of the substrate collection chamber 250.

In the second processing chamber 260, the substrate 211c can be bonded to the stack 80 from which the substrate 211a is separated. In the second processing chamber 260, for example, an adhesive is applied on the exposed layer 212, and the substrate 211c is attached thereon and pressed with a roller or the like, so that the substrate 211c is bonded to the layer 212.

The third unit 1030 has a function of supplying the substrate 211c to the second processing chamber 260. Note that the third unit 1030 will be described in detail in Embodiment 3.

Figure 26:
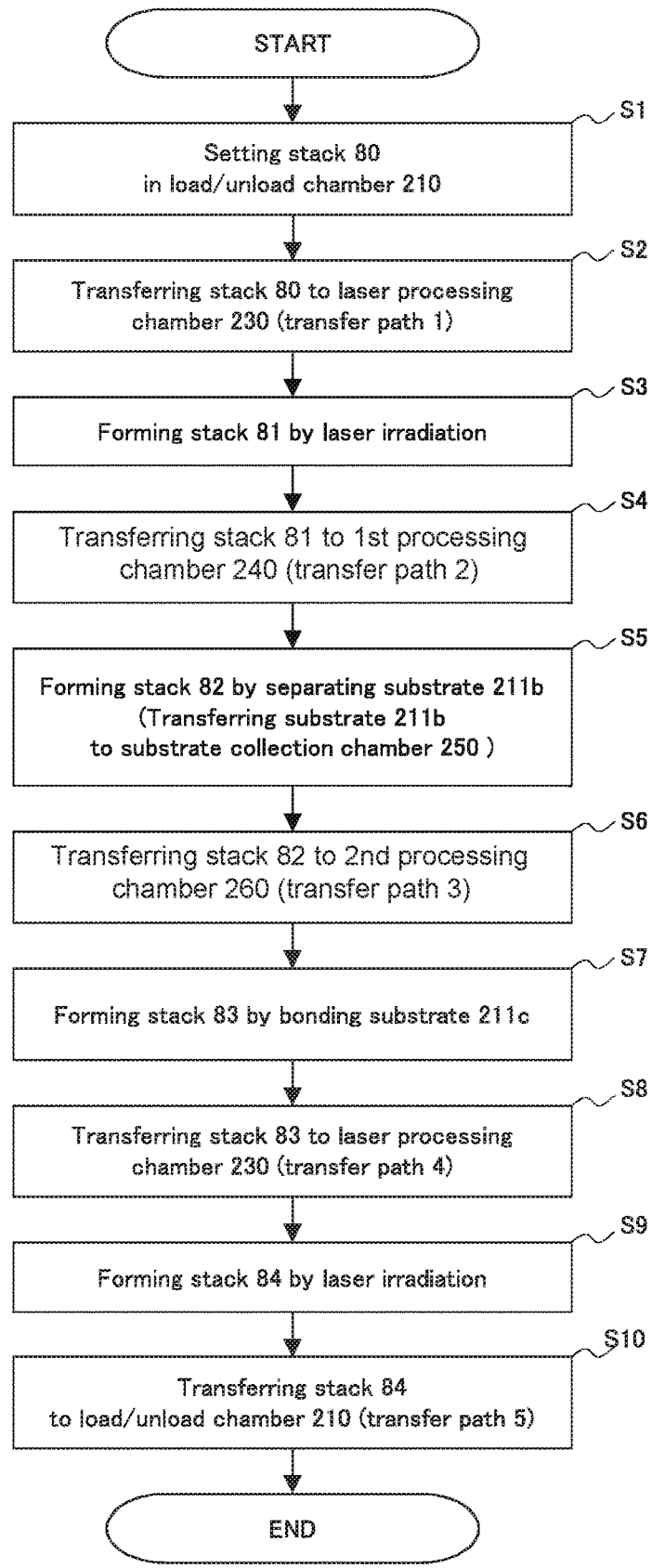
FIG. 26 is a flow chart showing an operation of a stack processing apparatus.

The details of processing the stack 80 are described with a flow chart in FIG. 26. Note that the numbers of transfer paths described below are shown in the drawing.

First, a cassette where the stack 80 is located is set in the load/unload chamber 210 (S1).

Next, the stack 80 is transferred to the laser processing chamber 230 (S2, transfer path 1). Then, the linear beam 271c shaped through the lens 285 is incident on a desired region of the stack 80 (S3, see FIG. 2A and FIG. 3). Here, the stack 80 that is processed by the laser is referred to as the stack 81.

Next, the stack 81 is transferred to the first processing chamber 240 (S4, transfer path 2). The substrate 211b is separated with the method illustrated in FIGS. 10A to 10C as an example, and the like (S5). The separated substrate 211b is transferred to and collected in the substrate collection chamber 250. Here, a stack in which the substrate 211b is separated from the stack 81 is referred to as the stack 82.

The stack 82 is transferred to the second processing chamber 260 (S6, transfer path 3). With use of the method and the like described above as an example, the substrate 211c that is supplied from the third unit 1030 is bonded to the exposed layer 212 (S7). Here, a stack in which the substrate 211c is bonded to the stack 82 is referred to as the stack 83.

The stack 83 is transferred to the laser processing chamber 230 (S8, transfer path 4). The linear beam 271c shaped through the lens 286 is incident on a desired region of the stack 83 (S9, see FIG. 2B and FIG. 4). Here, the stack 83 that is processed by the laser is referred to as the stack 84.

The stack 84 is transferred to the load/unload chamber 210 (S10, transfer path 5).

Figure 9B:
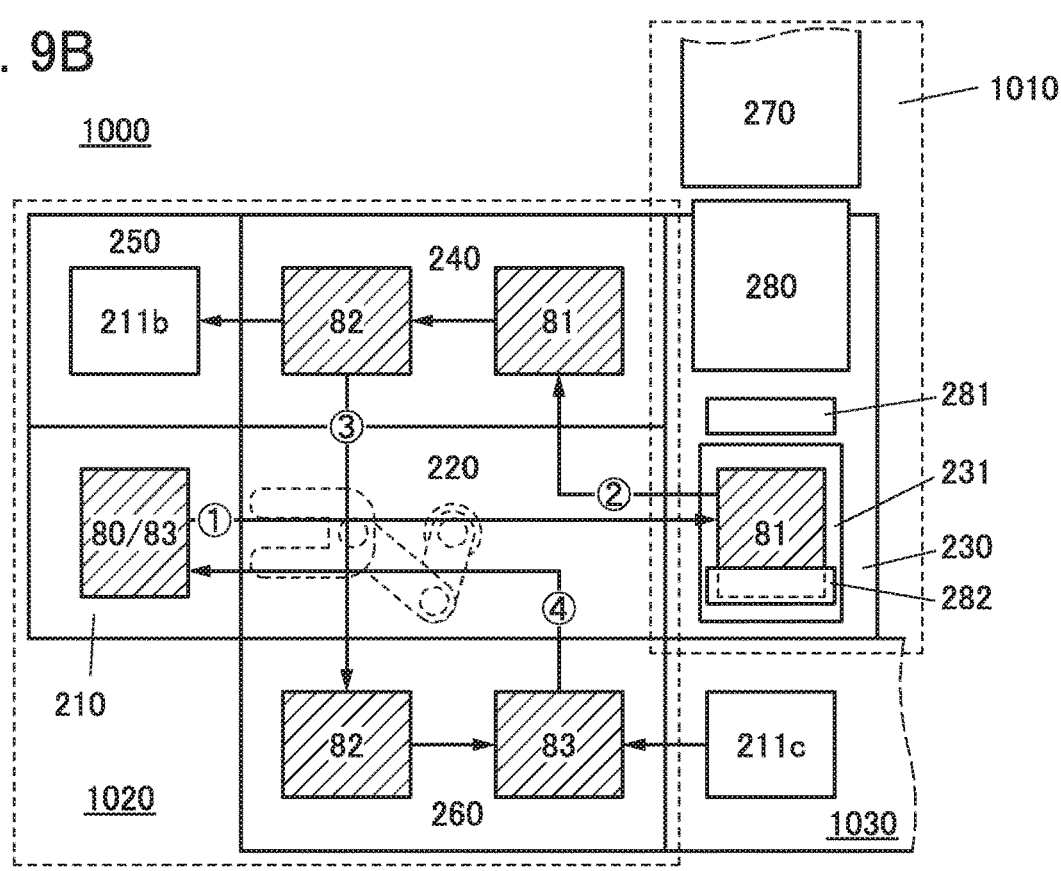

The steps described above are the step for replacing the substrate 211c with the substrate 211b and the step for separating the substrate 211a. In the case where the step for separating the substrate 211a is not performed, steps may be performed in accordance with the order of transfer-path numbers shown in FIG. 9B. In this case, the stack 83 that is formed in the second processing chamber 260 is transferred to the load/unload chamber 210.

Through the above step, the stack 80 can be processed into the stack 84 or the stack 83.

Note that this embodiment can be combined with any of the other embodiments in this specification as appropriate.

Embodiment 3

In this embodiment, description is given of a stack processing apparatus that is another embodiment. The stack processing apparatus described in this embodiment includes the stack processing apparatus in Embodiment 2.

Figure 11:
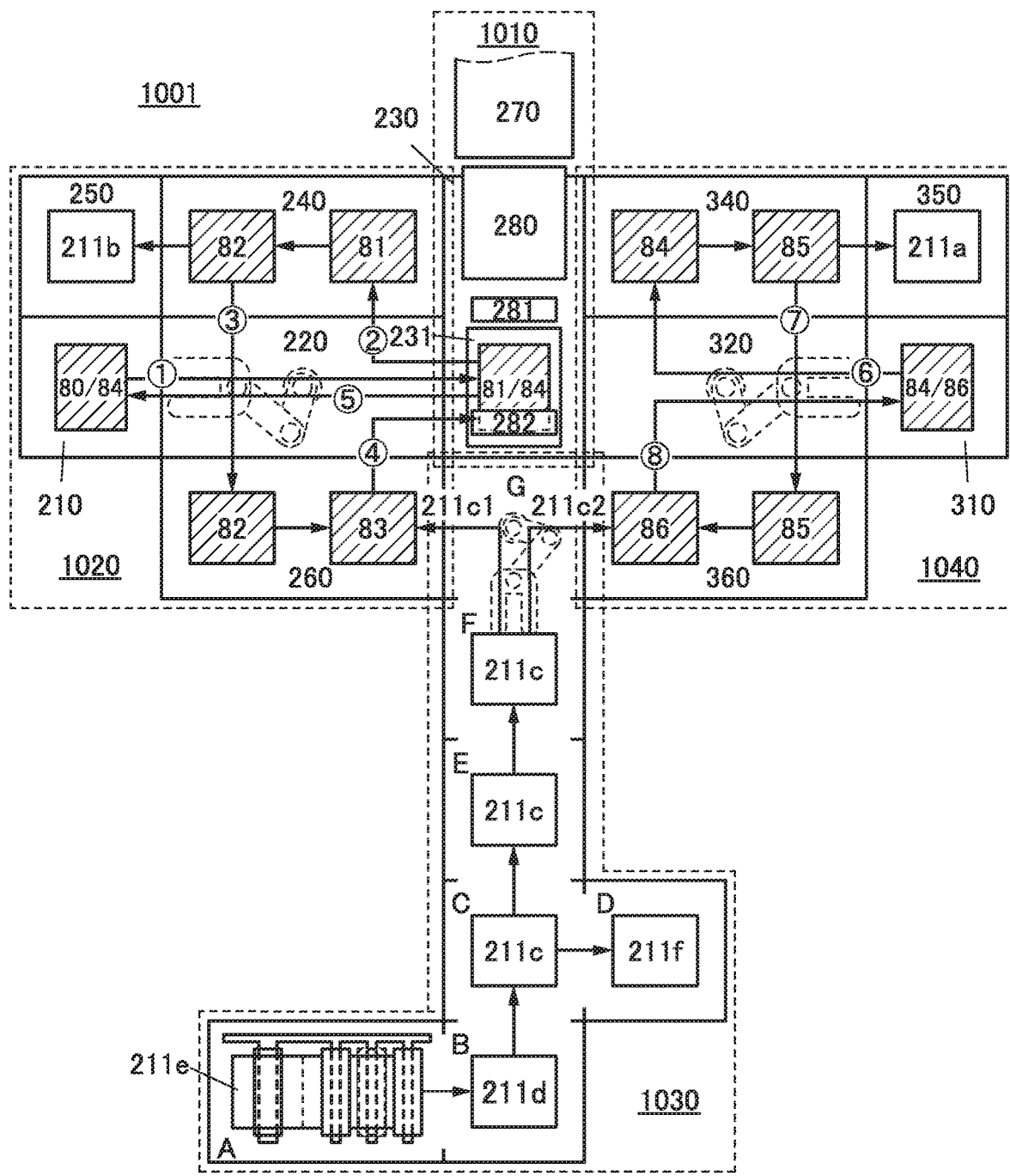
FIG. 11 illustrates a structure of a stack processing apparatus and transfer paths.

FIG. 11 is a schematic diagram illustrating a structure of a stack processing apparatus 1001 that is one embodiment of the present invention, and paths for transferring stacks 80 to 86. Here, the stack 80 indicates the structure 211 that has not been irradiated with the laser, as illustrated in FIGS. 6A to 6C and the like. The stack 86 indicates a stack that has been processed. The stacks 81 to 85 indicate stacks in the middle of processing.

With the stack processing apparatus 1001 described in this embodiment, a step of replacing a substrate 211c1 with the substrate 211b included in the stack 80 and a step of replacing a substrate 211c2 with the substrate 211a included in the stack 80 are performed.

The processing apparatus 1001 is mainly composed of four units including the first unit 1010, the second unit 1020, the third unit 1030, and a fourth unit 1040. The first unit 1010, the second unit 1020, and the third unit 1030 have structures similar to those in the processing apparatus 1000. The fourth unit 1040 includes a load/unload chamber 310, a transfer chamber 320, a third processing chamber 340, a fourth processing chamber 360, and a substrate collection chamber 350. Note that although the components are classified into four units for convenience, there is no limitation on each unit structure.

The load/unload chamber 310 and the transfer chamber 320 in the fourth unit 1040 can have structures similar to those of the load/unload chamber 210 and the transfer chamber 220 in the laser processing apparatus 200 described in Embodiment 1.

In the third processing chamber 340, a step of separating the substrate 211c1 and the layer 212 from a stack corresponding to the stack 84, that is, a step of separating the substrate 211a can be performed.

Figure 12A:
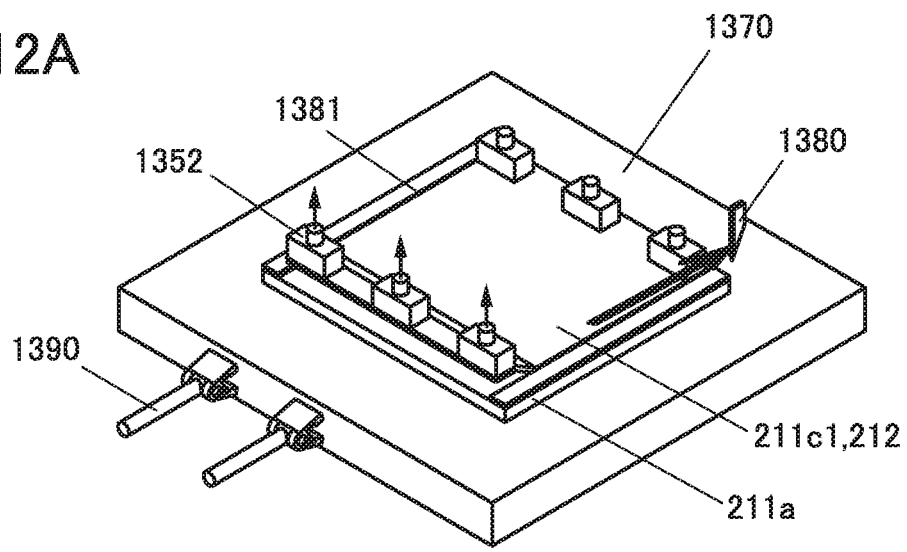
FIGS. 12A to 12C illustrate a separation step performed with a stack processing apparatus.

For the processing, a plurality of suction mechanisms 1352 and clamp jigs 1390 can be used, for example, as illustrated in FIG. 12A. A vacuum suction mechanism and an elevating mechanism are connected to the suction mechanisms 1352. Such mechanisms are attached on the vicinity of edges of the substrate 211c1 and the layer 212, and the substrate 211c1 and the layer 212 are lifted, so that the substrate 211a is separated. Furthermore, the clamp jigs 1390 are moved in a direction where the tension is applied to the substrate 211c1 and the layer 212 so that the separation operation is supported. The substrate 211a of the stack 80 can be fixed to the stage 1370 with the vacuum suction mechanism or the like.

Note that the separation of the substrate 211c1 and the layer 212 from the stack 84 is performed under the condition where the adhesion between the substrate 211a and the layer 212 is reduced by laser processing performed on the layer 212. In the case where the layer 212 has a region which is not irradiated with the laser as illustrated in FIGS. 6A and 6B, first, a cutting region 1381 is formed in the substrate 211c1 and the layer 212 so that the region which is not irradiated with the laser is separated with use of a knife-like jig 1380 or the like as illustrated in FIG. 12A, and then edges of the substrate 211c1 and the layer 212 are lifted with the suction mechanisms 1352.

Figure 12B:
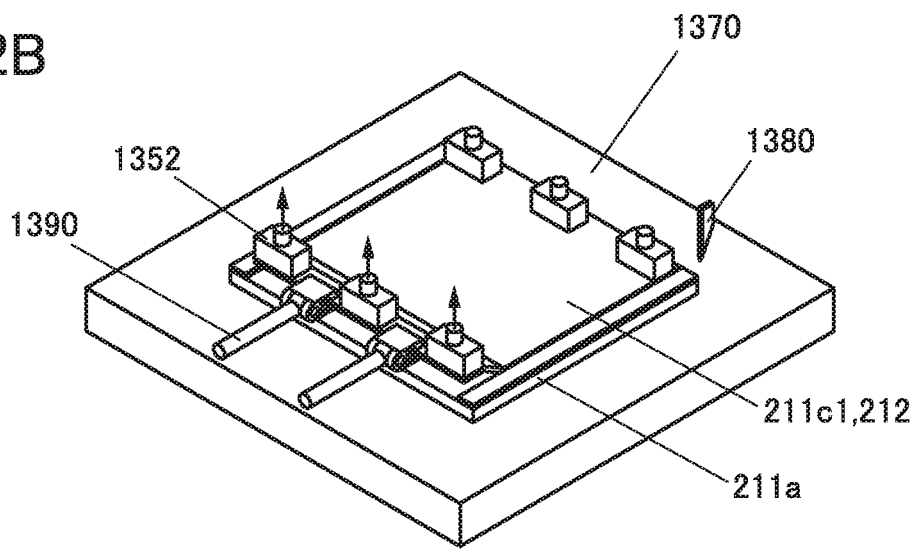
Figure 12C:
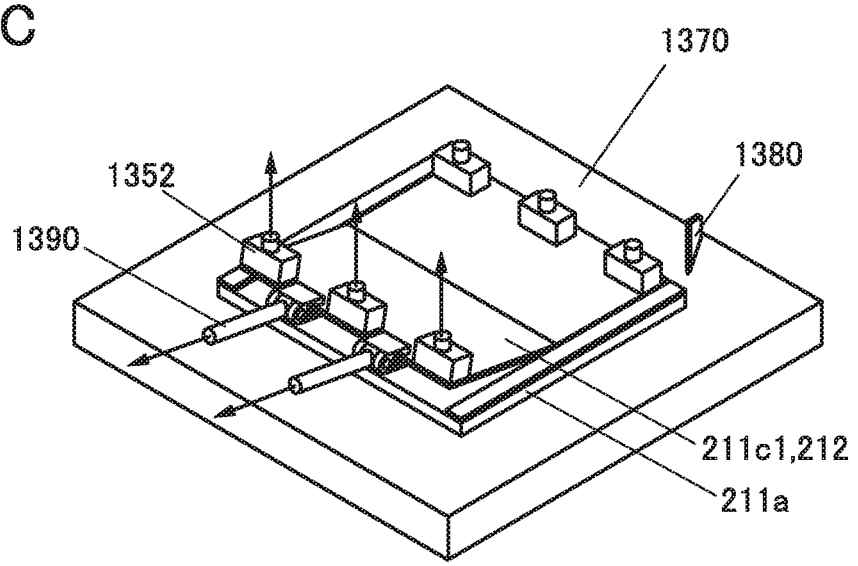

After that, as illustrated in FIGS. 12B and 12C, the vicinity of edges of the substrate 211c1 and the layer 212 are held by the clamp jig 1390, and the clamp jig 1390 is moved in the direction where the tension is applied to the substrate 211c1 and the layer 212, so that the separation operation is performed. In the case where the adhesion between the layer 212 and the substrate 211a is sufficiently reduced, the separation can be performed without the clamp jig 1390.

In the case where the whole of the layer 212 is subjected to laser processing as illustrated in FIG. 6C, a step of forming the cutting region 1381 with use of the jig 1380 is not needed.

The substrate collection chamber 350 has a function of collecting the substrate 211a from the stack 84. The third processing chamber 340 may have the function of the substrate collection chamber 250.

In the fourth processing chamber 360, a substrate 211c2 can be bonded to the stack 80 from which the substrate 211a is separated. For example, in the fourth processing chamber 360, an adhesive is applied to the exposed layer 212, and the substrate 211c2 is attached thereon and pressed with a roller or the like, so that the substrate 211c2 is bonded to the layer 212.

In the step of bonding the substrate 211c2, the stack 80 from which the substrate 211a is separated is preferably turned over in advance. The turnover can be performed when a transfer mechanism in the transfer chamber 320 is provided with a turnover mechanism as illustrated in FIG. 7A and FIGS. 8A to 8D. Alternatively, another turnover mechanism may be provided for the third processing chamber 340 or the fourth processing chamber 360. Note that the pressure is applied on the substrate 211c1 side with a roller or the like, whereby the substrate 211c2 may be bonded without the turnover operation.

The third unit 1030 has a function of supplying the substrate 211c1 to the second processing chamber 260 and a function of supplying the substrate 211c2 to the fourth processing chamber 360. Although the substrate 211c1 and the substrate 211c2 have the same structure as each other, they are assumed as different substrate here for convenience.

Note that the substrate 211c1 and the substrate 211c2 are specifically flexible substrates such as resin films.

Figure 27:
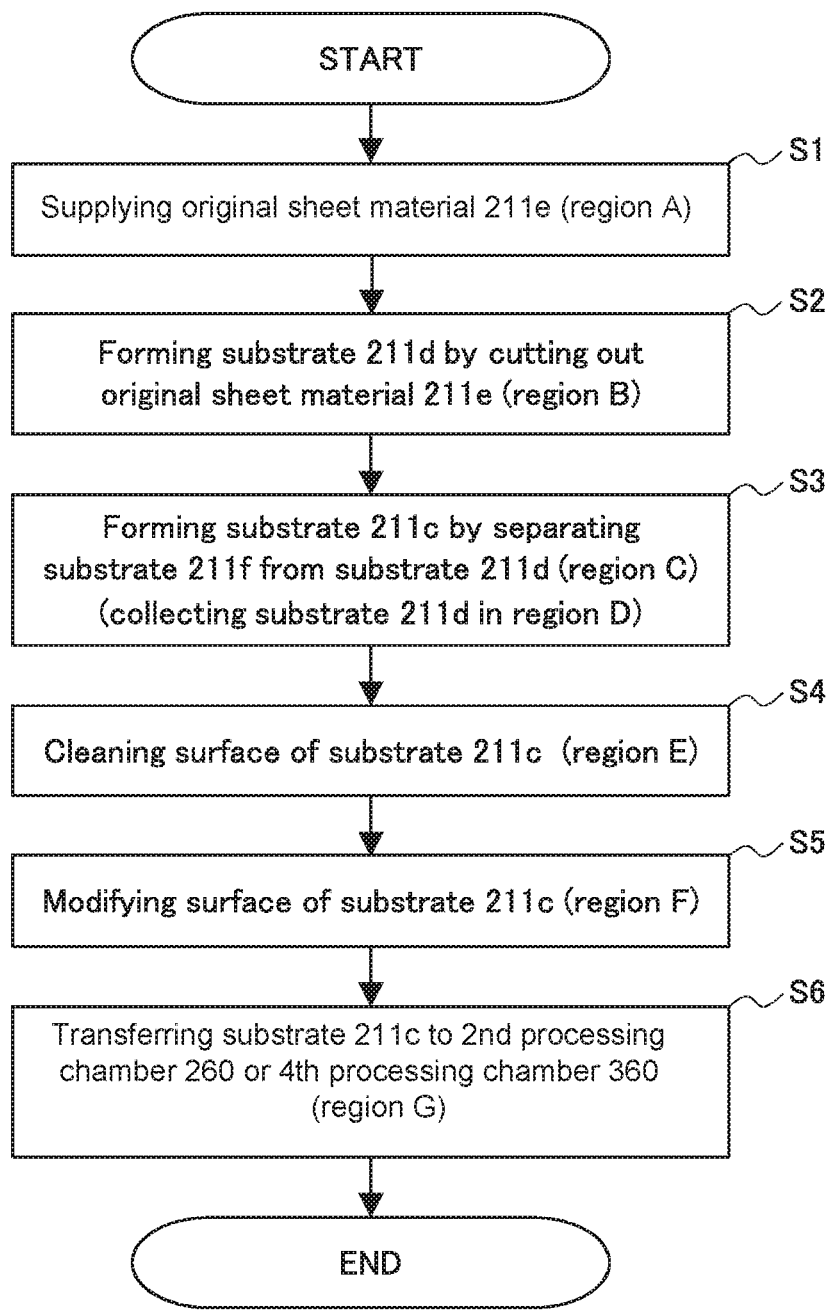
FIG. 27 is a flow chart showing an operation of a stack processing apparatus.

The third unit 1030 includes regions A to G. A function of each region and formation procedure of the substrate 211c1 and the substrate 211c2 are described with a flow chart in FIG. 27. Each of the regions A to F is provided with an appropriate transfer mechanism.

First, an original sheet material 211e of the substrate 211c1 and the substrate 211c2 is set in the region A and unwound (S1).

Next, the unwound original sheet material 211e is cut out in the region B, so that a substrate 211d is formed (S2). A region where the cut-out substrate 211d is stocked may be provided.

Next, a substrate 211f is separated from the substrate 211d in the region C, so that the substrate 211c is formed. Note that the substrate 211f is specifically a separate film or the like. The substrate 211f is collected in the region D (S3). In the case where the substrate 211f is not made, the functions of the regions C and D are not needed.

Next, a surface of the substrate 211c is cleaned in the region E (S4). The surface here indicates a face to which the layer 212 is attached in a later step. For the surface cleaning, for example, an ultrasonic dry cleaner or the like can be used. The ultrasonic dry cleaner is a dust collecting mechanism including a mechanism which sprays ultrasonic-vibrating air or a ultrasonic-vibrating gas such as nitrogen to the substrate surface and a mechanism which performs suction in its vicinity. With the ultrasonic dry cleaner, particles and the like can be removed efficiently.

Next, the surface of the substrate 211c is modified in the region F (S5). The surface improvement is also called activation in which a functional group is generated on the surface of the substrate 211c by irradiation with light with a short wavelength using a UV lamp or the like, for example. By the surface improvement, the wettability and adhesiveness with an adhesive in a later step can be improved. The surface improvement of the substrate 211c may be performed by corona discharge or the like.

In the region G, a transfer mechanism is provided, and the substrate 211c processed in the region F is transferred to the second processing chamber 260 as the substrate 211c1. Alternatively, the substrate 211c processed in the region F is transferred to the fourth processing chamber 360 as the substrate 211c2 (S6).

Figure 28:
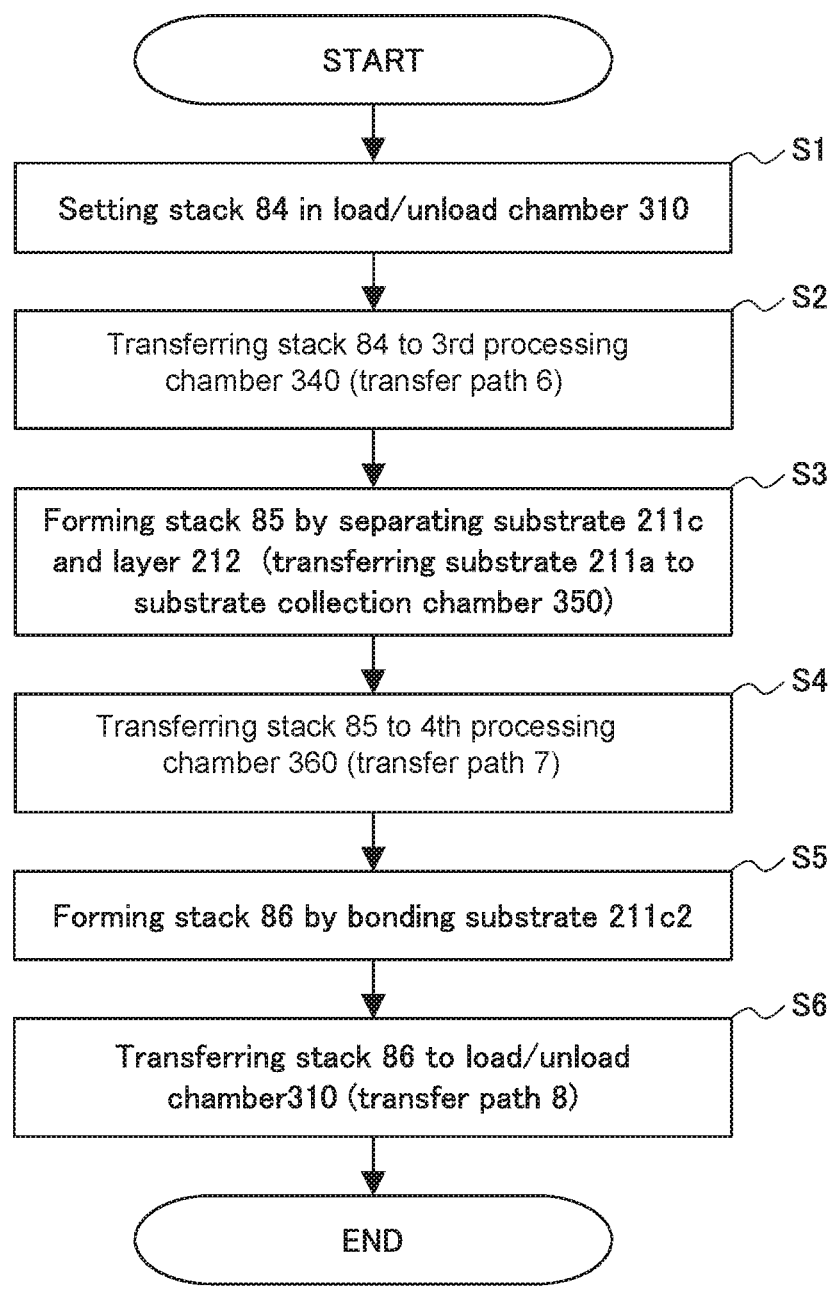
FIG. 28 is a flow chart showing an operation of a stack processing apparatus.

The details of processing the stack 84 in the fourth unit 1040 are described with a flow chart in FIG. 28. The transfer-path numbers described below are shown in the drawing of the fourth unit 1040. The stack 84 is formed by processing the stack 80 in the second unit 1020. For the processing method, Embodiment 2 can be referred to. As the structure of the stack 84, the substrate 211a, the layer 212, and the substrate 211c1 are stacked in this order.

First, a cassette in which the stack 84 formed in the second unit 1020 is located is provided in the load/unload chamber 310 (S1).

Next, the stack 84 is transferred to the third processing chamber 340 (transfer path 6, S2). Then, with the method illustrated in FIGS. 12A to 12C as an example, the substrate 211c1 and the layer 212 are separated (S3). The separated substrate 211a is transferred to and collected in the substrate collection chamber 350. Here, the stack 84 from which the substrate 211a is separated is the stack 85.

Next, the stack 85 is transferred to the fourth processing chamber 360 (transfer path 7, S4). Then, with the example of the method described above, the substrate 211c2 is bonded to the exposed layer 212 (S5). A stack formed by bonding the substrate 211c2 to the stack 85 is referred to as the stack 86.

Next, the stack 86 is transferred to the load/unload chamber 310 (transfer path 8, S6).

The steps described above are the step for replacing the substrate 211c1 with the substrate 211b in the second unit 1020 and the step for separating the substrate 211a. In the case where the step for separating the substrate 211a is not performed in the second unit 1020, steps may be performed in accordance with the order of transfer-path numbers shown in FIG. 13. In this case, the stack 83 formed in the second processing chamber 260 is transferred to the load/unload chamber 210 in the second unit 1020. Then, the stack 83 is transferred from the fourth unit 1040 to the laser processing chamber 230, and laser processing, i.e., the step for separating the substrate 211a, may be performed.

Figure 13:
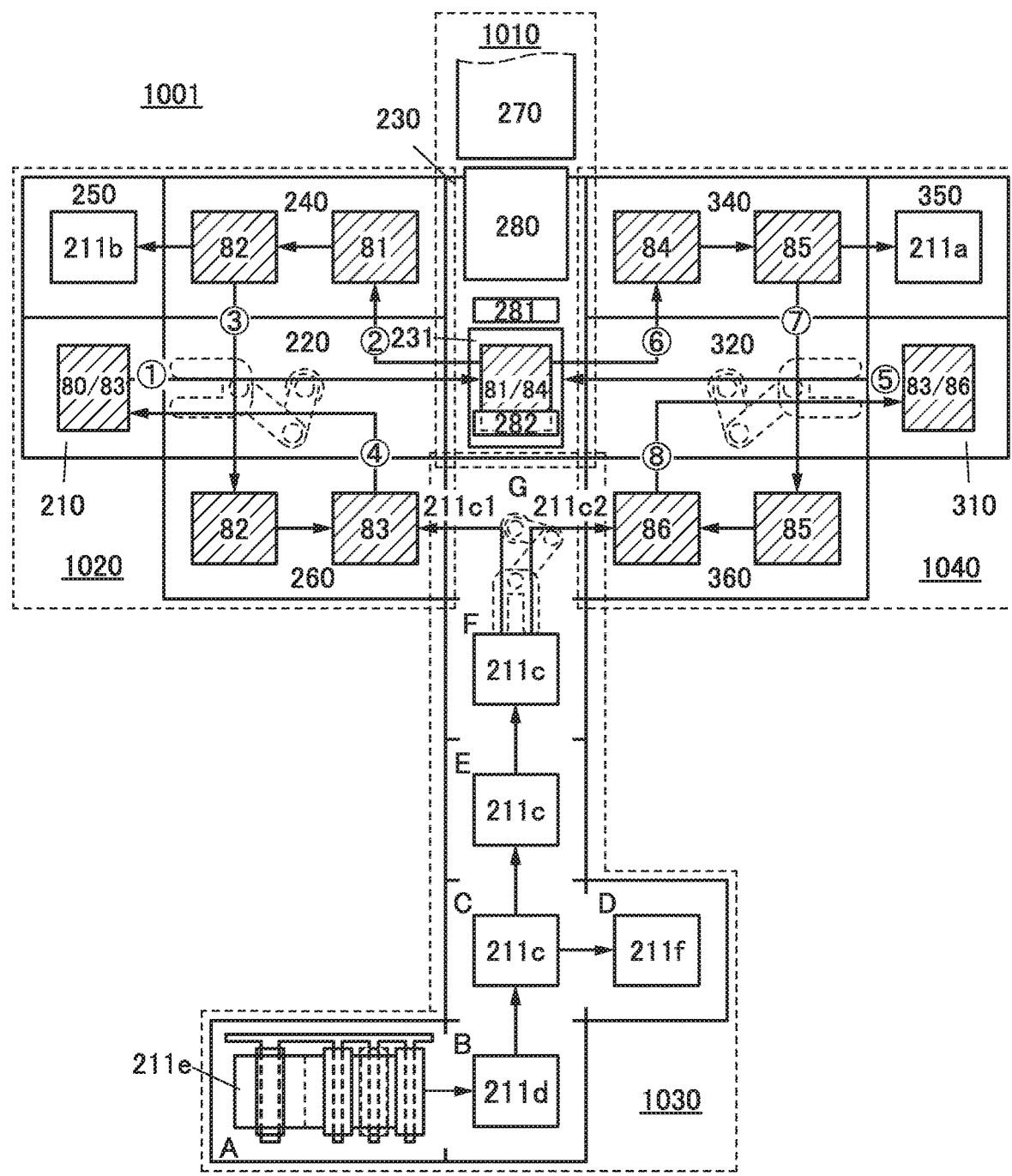
FIG. 13 illustrates a structure of a stack processing apparatus and transfer paths.
Figure 14:
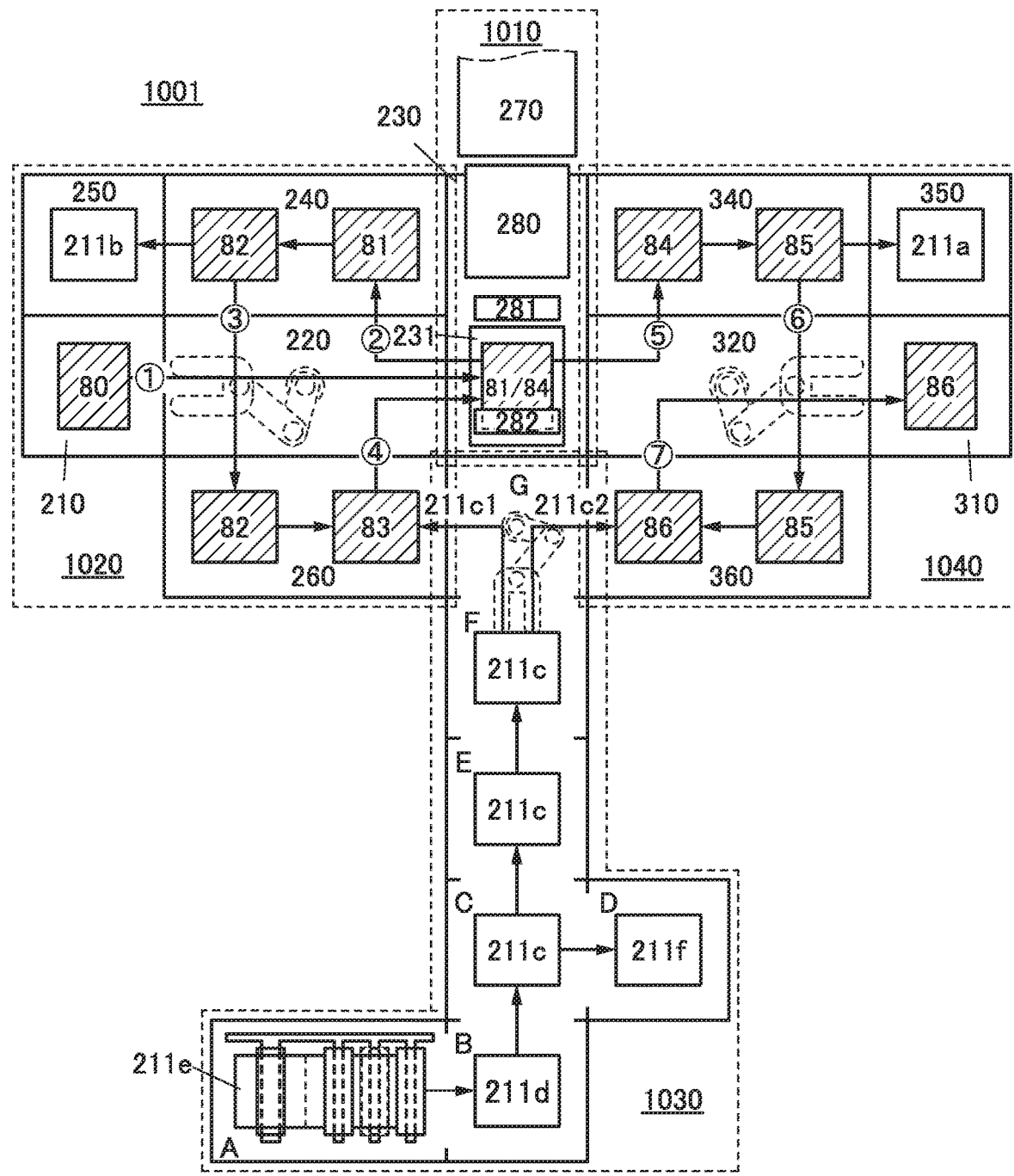
FIG. 14 illustrates a structure of a stack processing apparatus and transfer paths.

The apparatuses illustrated in FIG. 11 and FIG. 13 each show a structure in which the stack 83 or 84 which has been subjected to the process conducted in the second unit 1020 is extracted from the load/unload chamber 210 and located in the load/unload chamber 310 in the fourth unit 1040, and then the steps are continued. However, as illustrated in FIG. 14, the laser processing chamber 230 may have a function as a delivery chamber. In this case, the load/unload chamber 210 functions only as a load chamber, and the load/unload chamber 310 functions only as an unload chamber.

Figure 15A:
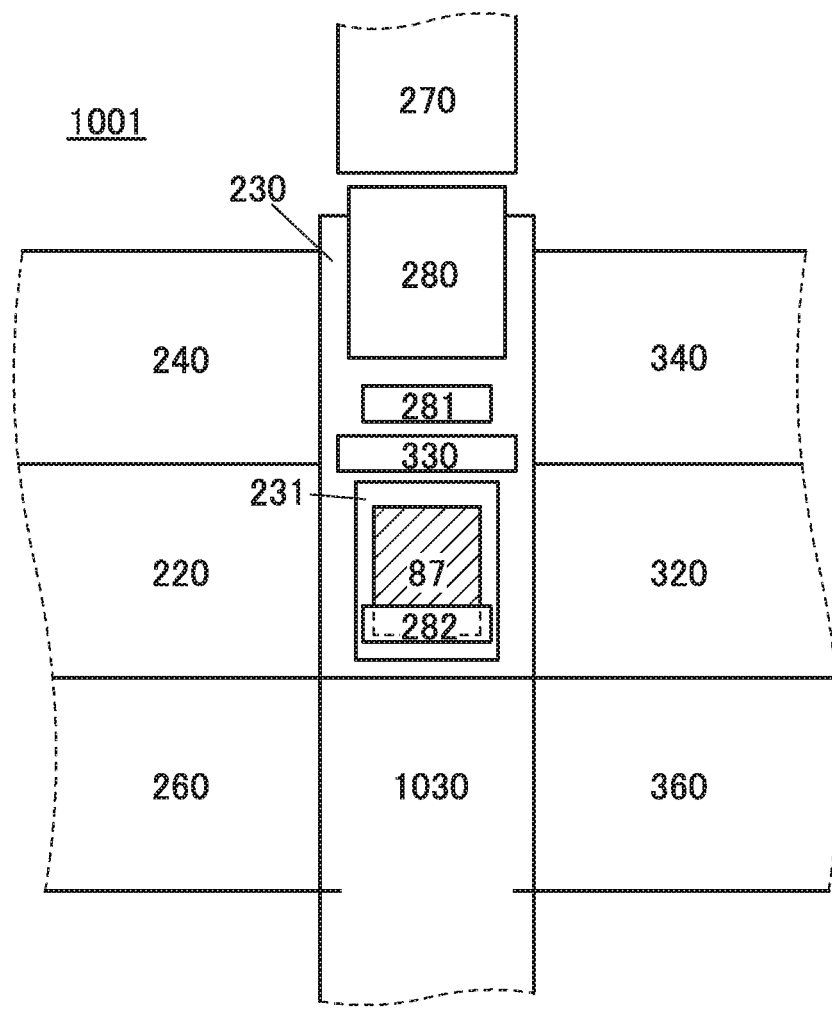
FIGS. 15A and 15B illustrate a structure of a stack processing apparatus.
Figure 15B:
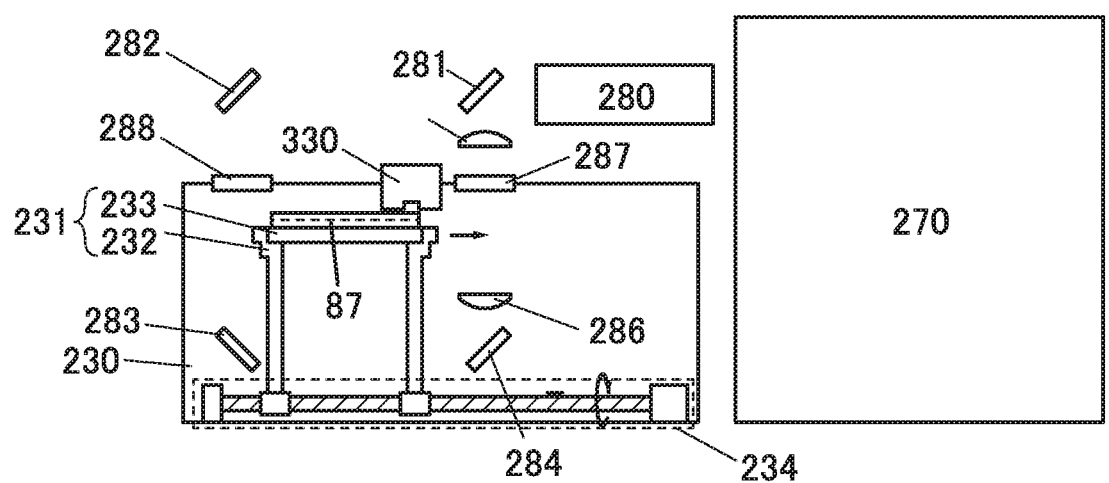

The laser processing chamber 230 may include a dust collecting mechanism such as an ultrasonic dry cleaner. FIG. 15A is a top view of the processing apparatus 1001 including the laser processing chamber 230 provided with a dust collecting mechanism 330, and FIG. 15B is a side view illustrating structures of an inside of the laser processing chamber 230 and other optical components. The dust collecting mechanism 330 may be positioned by operation of the horizontal moving mechanism 234 so that a top surface of a stack 87 can be cleaned. Here, the stack 87 indicates any of the stacks 80 to 86.

The cleaning with use of the dust collecting mechanism 330 can be performed at a given timing. For example, FIG. 16 shows transfer paths in the case where the surface cleaning is performed on the layer 212 exposed after the substrate 211b and the substrate 211a are separated, which are based on the transfer paths in FIG. 13.

First, the stack 80 is transferred from the load/unload chamber 210 to the laser processing chamber 230 through the transfer path 1, and laser processing is performed, whereby the stack 81 is formed.

The stack 81 is transferred to the first processing chamber 240 through the transfer path 2, and the substrate 211b is separated, whereby the stack 82 is formed.

The stack 82 is transferred to the laser processing chamber 230 through the transfer path 3, and the surface of the layer 212 is cleaned with the dust collecting mechanism 330.

Next, the stack 82 is transferred to the second processing chamber 260 through the transfer path 4, and the substrate 211c1 is bonded to the layer 212, whereby the stack 83 is formed.

The stack 83 is transferred to the load/unload chamber 210 through the transfer path 5.

Next, the stack 83 is located in the load/unload chamber 310 and transferred to the laser processing chamber 230 through the transfer path 6. Then, laser processing is performed, whereby the stack 84 is formed.

The stack 84 is transferred to the third processing chamber 340 through the transfer path 7, and the substrate 211a is separated, whereby the stack 85 is formed.

The stack 85 is transferred to the laser processing chamber 230 through the transfer path 8, and the surface of the layer 212 is cleaned with the dust collecting mechanism 330. The stack 85 is turned over so that the layer 212 is positioned at a top surface before the stack 85 arrives at the laser processing chamber 230.

The stack 85 is transferred to the fourth processing chamber 360 through the transfer path 9, and the substrate 211c2 is bonded to the layer 212, whereby the stack 86 is formed.

The stack 86 is transferred to the load/unload chamber 310 through the transfer path 10.

Note that the structure in which the laser processing chamber 230 includes the dust collecting mechanism 330 can be employed for the laser processing apparatus 200 described in Embodiment 1 and the processing apparatus 1000 described in Embodiment 2. Alternatively, the dust collecting mechanism 330 may be provided as an independent unit instead of being provided in the laser processing chamber 230.

The processing apparatus 1001 operates with any of the above-described structures and a method suitable for the structure, whereby the stack 80 can be processed into the stack 86.

Note that this embodiment can be combined with any of the other embodiments in this specification as appropriate.

Embodiment 4

In this embodiment, a separation method of a structure and a manufacturing method of a flexible device of embodiments of the present invention will be described. Note that for the separation of the structure and manufacturing the flexible device, a laser processing apparatus or a stack processing apparatus of embodiments of the present invention can be used.

One embodiment of the present invention is a separation method including a step of forming a resin layer over a substrate, a step of forming a transistor including an oxide semiconductor in a channel formation region over the resin layer, a step of irradiating the resin layer with laser light that is shaped into a linear beam, and a step of separating the transistor and the substrate.

An oxide semiconductor is used for the channel formation region of the transistor. With use of an oxide semiconductor, the maximum process temperature can be lower than that of the case of using low-temperature polysilicon (LTPS).

When LTPS is used for the channel formation region of the transistor, the maximum temperature of process reaches approximately 500° C. to 550° C. Thus, the resin layer needs to have heat resistance. The resin layer is required to have a larger thickness to relieve the damage to an insulating layer or the like at the periphery of the resin layer in a laser crystallization step. Furthermore, a large thickness of the resin layer is required to suppress the degradation of characteristics caused by laser irradiation on the channel formation region of the completed transistor.

In contrast, the transistor formed using an oxide semiconductor does not need heat treatment at high temperatures, and can be formed at a temperature lower than or equal to 350° C., or even lower than or equal to 300° C. Thus, the resin layer is not required to have high heat resistance. In other words, a relatively inexpensive resin whose heat-resistance temperature is low can be used for the resin layer. Furthermore, the transistor formed using an oxide semiconductor does not need a laser crystallization step. The oxide semiconductor has a wide band gap greater than or equal to 2.5 eV and lower than or equal to 3.5 eV, and absorbs a larger amount of laser light with a specific wavelength than silicon. Thus, there is no problem when the resin layer has a small thickness. Since the resin layer is not required to have high heat resistance and can be thinned, the manufacturing cost of a device can be significantly reduced. An oxide semiconductor is preferably used, in which case the steps can be simplified as compared with the case where LTPS is used.

In one embodiment of the present invention, a transistor or the like is formed at a temperature lower than or equal to the allowable temperature limit of the resin layer. Here, the heat resistance of the resin layer can be measured by, for example, a weight loss percentage due to heat, specifically, the 5% weight loss temperature. The 5% weight loss temperature of the resin layer is preferably lower than or equal to 450° C., further preferably lower than or equal to 400° C., still further preferably lower than 350° C. For example, a transistor is formed at a temperature lower than or equal to 350° C., or even lower than or equal to 300° C.

In one embodiment of the present invention, a resin layer may be formed using a photosensitive material. With the photosensitive material, a resin layer with a desired shape can be easily formed. For example, a resin layer having an opening or a resin layer having two or more regions with different thicknesses can be easily formed. Accordingly, the resin layer can be prevented from hindering formation of a back gate, an external connection terminal, a through electrode, or the like.

In one embodiment of the present invention, laser light shaped into a linear beam is used. A laser apparatus used in a manufacturing line for LTPS or the like can be effectively used. The laser light is condensed in a long rectangular shape (is shaped into a linear laser beam) so that the resin layer is irradiated with light.

A flexible device can be manufactured using the separation method of a structure of one embodiment of the present invention. An example of a manufacturing method of a flexible device is shown with reference to FIGS. 17A to 17D and FIGS. 18A to 18D.

First, as illustrated in FIG. 17A, a stack 110 and a stack 120 are attached to each other with a bonding layer 132, so that a stack 130 is formed.

The stack 110 includes, for example, a substrate 111, a resin layer 112, an insulating layer 113, a first element layer 114, and a second element layer 131.

The stack 120 includes, for example, a substrate 121, a resin layer 122, an insulating layer 123, and a functional layer 124. The stack 130 corresponds to the structure 211 or the stack 80 described in Embodiments 1 to 3. The substrate 111 corresponds to one of the substrate 211a and the substrate 211b, and the substrate 121 corresponds to the other of the substrate 211a and the substrate 211b. The resin layer 112, the insulating layer 113, the first element layer 114, the second element layer 131, the functional layer 124, the insulating layer 123, and the resin layer 122 collectively correspond to the layer 212.

For the substrates 111 and 121, a rigid substrate such as a glass substrate can be used. Since the resin layers 112 and 122 are irradiated with laser light through the substrates 111 and 121 in a later step, the substrates 111 and 121 preferably have high transmittance to the laser light.

For the resin layers 112 and 122, a photosensitive and thermosetting material can be used, for example.

For the insulating layers 113 and 123, an inorganic insulating layer can be used, for example.

The first element layer 114 includes, for example, a transistor including an oxide semiconductor in a channel formation region.

The second element layer 131 includes an EL element, for example.

The functional layer 124 can include at least one of a coloring layer such as a color filter, a light-blocking layer such as a black matrix, and a sensor element such as a touch sensor.

Next, as illustrated in FIG. 17B, the resin layer 122 is irradiated with laser light 160 that is shaped into a linear beam through the substrate 121. Irradiation with the laser light 160 may be performed while the laser light 160 is moved relatively to the substrate 121. Although an example in which the substrate 111 is separated ahead of the substrate 121 is shown here, one embodiment of the present invention is not limited thereto. In the case where the substrate 111 is separated first, the resin layer 112 may be irradiated with the laser light 160 through the substrate 111.

Next, as illustrated in FIG. 17C, the substrate 121 is separated from the stack 130. FIG. 17C illustrates an example in which separation occurs in the resin layer 122. Part of the resin layer (a resin layer 122a) remains on the substrate 121. The thickness of the resin layer 122 remaining on the insulating layer 123 side is reduced as compared with that in FIG. 17B. Note that separation may occur at the interface between the substrate 121 and the resin layer 122 depending on the manufacturing conditions (e.g., the material of the resin layer 122 and laser irradiation conditions).

Next, as illustrated in FIG. 17D, the exposed resin layer 122 and a substrate 151 are attached to each other. The substrate 151 preferably has flexibility. For example, the resin layer 112 and the substrate 151 can be attached to each other with an adhesive.

Figure 18A:
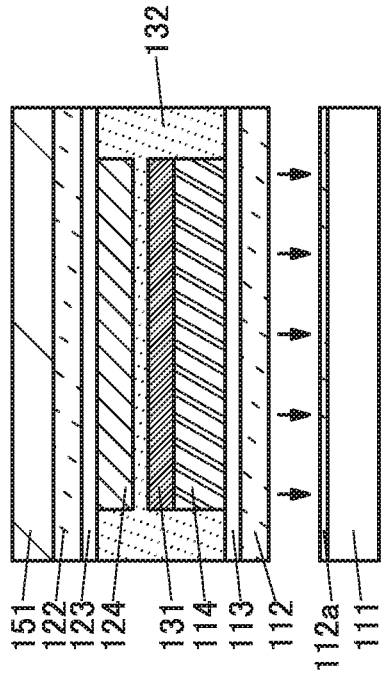
FIGS. 18A to 18D illustrate an example of a manufacturing method of a flexible device.

Next, as illustrated in FIG. 18A, the resin layer 112 is irradiated with the laser light 160 that is shaped into a linear beam through the substrate 111. Irradiation with the laser light 160 may be performed while the laser light 160 is moved relatively to the substrate 111.

Figure 18B:
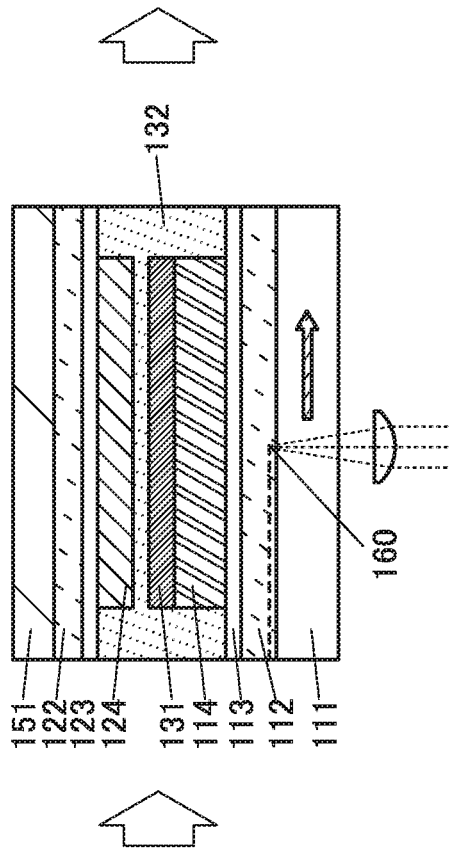

Next, as illustrated in FIG. 18B, the substrate 111 is separated from a stack illustrated in FIG. 18A. FIG. 18B illustrates an example where separation occurs in the resin layer 112. Part of the resin layer (a resin layer 112a) remains on the substrate 111. The thickness of the resin layer 112 remaining on the insulating layer 113 side is reduced as compared with that in FIG. 18B.

Figure 18C:
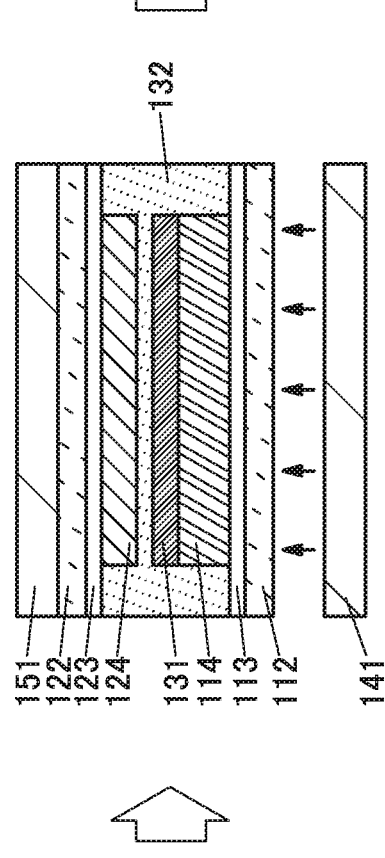

Next, as illustrated in FIG. 18C, the exposed resin layer 112 and a substrate 141 are attached to each other. The substrate 141 preferably has flexibility.

Figure 18D:
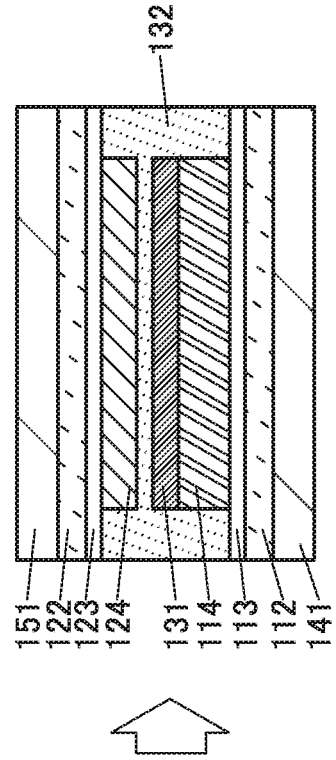

Through the above steps, a flexible device 100 illustrated in FIG. 18D can be fabricated.

In the separation method of a structure and the manufacturing method of a flexible device of embodiments of the present invention, the manufacturing process of the transistor can be performed at a relatively low temperature with use of an oxide semiconductor in a channel formation region of the transistor. A resin layer whose heat resistance is not high can be used, and a thin thickness can be employed for the manufacturing process. Thus, the material of the resin layer can be selected from a wide range, high mass productivity can be obtained at low cost, and a large substrate can be used, for example.

A specific method for manufacturing a flexible device of one embodiment of the present invention will be described below with reference to FIGS. 19A to 19E, FIGS. 20A to 20C, FIGS. 21A and 21B, and FIGS. 22A to 22C. Here, an example in which a display device including a transistor and an organic EL element is fabricated as the flexible device will be described. With use of a flexible material for a substrate, the display device can be a foldable organic EL display device.

Figure 19A:
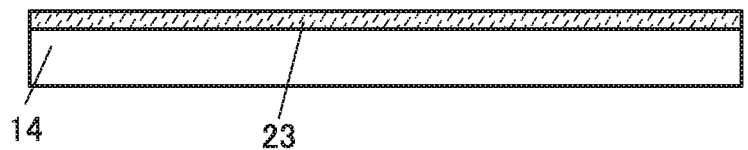
FIGS. 19A to 19E illustrate an example of a manufacturing method of a flexible device.

First, a resin layer 23 is formed over a substrate 14 using a photosensitive and thermosetting material (see FIG. 19A).

For the substrate 14, glass, quartz, ceramic, sapphire, an organic resin, or the like can be used, for example. Examples of the glass include alkali-free glass, barium borosilicate glass, and aluminoborosilicate glass.

The resin layer 23 is formed to have a thickness greater than or equal to 0.1 µm and less than or equal to 3 µm by applying the photosensitive and thermosetting material and performing heat treatment. In particular, the heat treatment is preferably performed at a temperature higher than the manufacturing temperature of each layer formed over the resin layer 23. For example, in the case where the manufacturing temperature of the transistor is below 350° C., a film to be the resin layer 23 is preferably heated at a temperature higher than 350° C. and lower than or equal to 450° C., further preferably lower than or equal to 400° C., still further preferably lower than 400° C., and still yet further preferably lower than 375° C. Thus, a gas released from the resin layer 23 in the fabrication process of the transistor can be significantly reduced.

A photosensitive material is used for the resin layer 23, and thus part thereof can be removed. Specifically, heat treatment (also referred to as pre-baking treatment) for removing a solvent is performed after deposition of a material, and then light exposure is selectively performed. Next, development is performed, whereby an unnecessary portion can be removed. After that, heat treatment (also referred to as post-baking) is preferably performed. In the post-baking, heating is preferably performed at a temperature higher than or equal to the formation temperature of each layer formed over the resin layer 23.

The resin layer 23 has flexibility. The substrate 14 has lower flexibility than the resin layer 23 does. Since the resin layer 23 is formed over the substrate 14, the resin layer 23 can be transferred easily.

The resin layer 23 is preferably formed using a photosensitive polyimide resin (also referred to as PSPI). Examples of materials which can be used to form the resin layer 23 include an acrylic resin, an epoxy resin, a polyamide resin, a polyimide-amide resin, a siloxane resin, a benzocyclobutene-based resin, and a phenol resin.

The thickness of the resin layer 23 is preferably greater than or equal to 0.01 µm and less than 10 µm, further preferably greater than or equal to 0.1 µm and less than or equal to 3 µm, and still further preferably greater than or equal to 0.5 µm and less than or equal to 1 µm.

The resin layer 23 can be formed by spin coating, dipping, spray coating, ink-jetting, dispensing, screen printing, or offset printing, or with a doctor knife, a slit coater, a roll coater, a curtain coater, or a knife coater, for example.

The thermal expansion coefficient of the resin layer 23 is preferably greater than or equal to 0.1 ppm/° C. and less than or equal to 20 ppm/° C., and further preferably greater than or equal to 0.1 ppm/° C. and less than or equal to 10 ppm/° C. The lower the thermal expansion coefficient of the resin layer 23 is, the more the breakage of the transistor or the like by heating can be prevented.

In the case where the resin layer 23 is positioned on the display surface side of the display device, the resin layer 23 preferably has a high visible-light transmitting property.

Figure 19B:
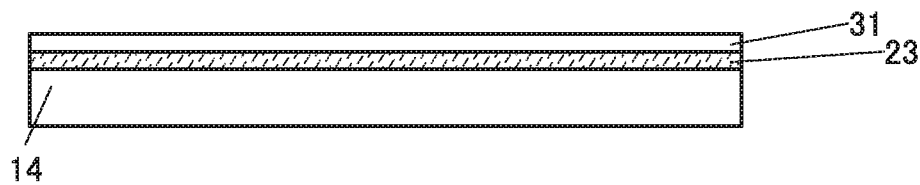

Next, the insulating layer 31 is formed over the resin layer 23 (see FIG. 19B).

The insulating layer 31 is formed at a temperature lower than or equal to the allowable temperature limit of the resin layer 23. In addition, the insulating layer 31 is preferably formed at a temperature lower than or equal to the heating temperature in the above-described heating step of the resin layer 23.

The insulating layer 31 can be used as a barrier layer that prevents diffusion of impurities contained in the resin layer 23 into a transistor and a display element formed later. For example, the insulating layer 31 can prevent moisture and the like contained in the resin layer 23 from diffusing into the transistor and the display element when the resin layer 23 is heated.

For the insulating layer 31, an inorganic insulating film such as a silicon nitride film, a silicon oxynitride film, a silicon oxide film, a silicon nitride oxide film, an aluminum oxide film, or an aluminum nitride film can be used, for example. A stack including two or more of the above insulating films may also be used. It is particularly preferable that a silicon nitride film be formed over the resin layer 23 and a silicon oxide film be formed over the silicon nitride film. An inorganic insulating film is preferably formed at high temperatures because the film can have higher density and barrier property as the deposition temperature becomes higher.

In the case where the resin layer 23 has an uneven surface, the insulating layer 31 may function as a planarization layer which fills the unevenness. It is possible to use a stack including an organic insulating material and an inorganic insulating material for the insulating layer 31, for example. As the organic insulating material, the resin that can be used for the resin layer 23 can be used.

Figure 19C:
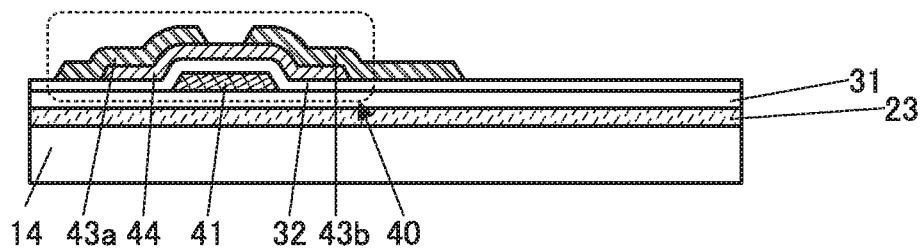

Next, a transistor 40 is formed over the insulating layer 31 (see FIG. 19C). Here, an example where a bottom-gate transistor including an oxide semiconductor layer 44 is formed as an example of the transistor 40 is described. When a semiconductor material having a wider band gap and a lower carrier density than silicon is used for a semiconductor film of the transistor, the off-state current of the transistor can be reduced.

Note that there is no particular limitation on the structure of the transistor 40. For example, a planar transistor, a staggered transistor, or an inverted staggered transistor may be used. A top-gate transistor or a bottom-gate transistor may be used. Gate electrodes may be provided above and below a channel.

Furthermore, the transistor 40 is fabricated at a temperature lower than or equal to the heat resistant temperature of the resin layer 23. In addition, the transistor 40 is preferably formed at a temperature lower than or equal to the heating temperature in the above-described heating step of the resin layer 23.

Specifically, first, a conductive layer 41 is formed over the insulating layer 31. The conductive layer 41 can be formed in the following manner: a conductive film is formed, a resist mask is formed, the conductive film is etched, and the resist mask is removed.

The conductive layer 41 can have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO to which gallium is added, or indium tin oxide containing silicon may be used.

Next, an insulating layer 32 is formed. For the insulating layer 32, the description of the inorganic insulating film that can be used for the insulating layer 31 can be referred to.

Then, the oxide semiconductor layer 44 is formed. The oxide semiconductor layer 44 can be formed in the following manner: an oxide semiconductor film is formed, a resist mask is formed, the oxide semiconductor film is etched, and the resist mask is removed.

The substrate temperature during the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

The oxide semiconductor film can be deposited by a sputtering method, and the percentage of oxygen flow rate in deposition is preferably higher than or equal to 0% and lower than or equal to 30%, further preferably higher than or equal to 5% and lower than or equal to 30%, and still further preferably higher than or equal to 7% and lower than or equal to 15%.

As an oxide target that can be used for forming the oxide semiconductor film, an In-M-Zn-based oxide (M is Al, Ga, Y, or Sn) can be used. In particular, an In—Ga—Zn-based oxide is preferably used.

For deposition of the oxide semiconductor film, instead of a sputtering method, a pulsed laser deposition (PLD) method, a chemical vapor deposition (CVD) method, a plasma enhanced CVD (PECVD) method, an atomic layer deposition (ALD) method, a vacuum evaporation method, or the like may be used, for example. Examples of CVD method include a metal organic CVD (MOCVD) method.

Next, a conductive layer 43a and a conductive layer 43b are formed. The conductive layers 43a and 43b can be formed in the following manner: a conductive film is formed, a resist mask is formed, the conductive film is etched, and the resist mask is removed.

Note that during the processing of the conductive layers 43a and 43b, the oxide semiconductor layer 44 might be partly etched to be thin in a region not covered by the resist mask.

Through the above process, the transistor 40 can be fabricated. In the transistor 40, part of the conductive layer 41 functions as a gate, part of the insulating layer 32 functions as a gate insulating layer, and the conductive layers 43a and 43b function as a source and a drain.

After that, an insulating layer 33 that covers the transistor 40 is formed. The insulating layer 33 can be formed in a manner similar to that of the insulating layer 32.

It is preferable to use an oxide insulating film, such as a silicon oxide film or a silicon oxynitride film, formed at a relatively low temperature in the above range in an atmosphere containing oxygen for the insulating layer 33. An insulating film with low oxygen diffusibility and oxygen permeability, such as a silicon nitride film, is preferably stacked over the silicon oxide film or the silicon oxynitride film. The oxide insulating film formed at a relatively low temperature in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the oxide semiconductor layer 44. As a result, oxygen vacancies in the oxide semiconductor layer 44 can be filled and defects at the interface between the oxide semiconductor layer 44 and the insulating layer 33 can be repaired, leading to a reduction in defect levels. Accordingly, an extremely highly reliable semiconductor device can be fabricated.

Figure 19D:
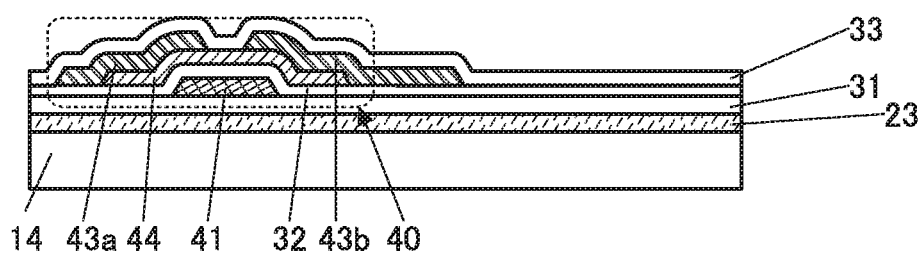

Through the above steps, the insulating layer 31, the transistor 40, and the insulating layer 33 can be formed over the resin layer 23 (see FIG. 19D).

If the substrate 14 and the insulating layer 31 are separated from each other at this stage by a method described later, a flexible device including no display element can be fabricated. A flexible device including a semiconductor circuit can be manufactured by forming the transistor 40 and forming a capacitor, a resistor, a wiring, and the like, for example.

Figure 19E:
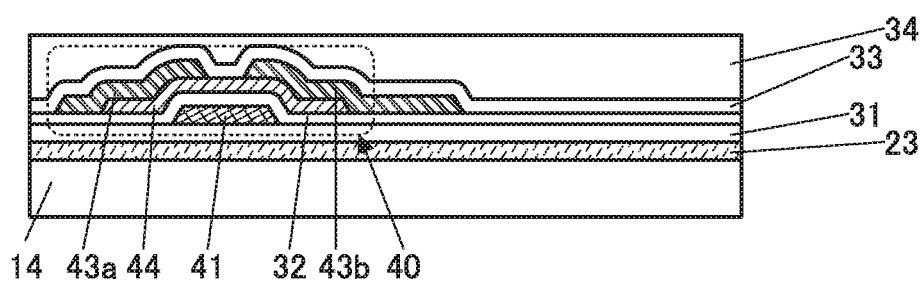

Next, an insulating layer 34 is formed over the insulating layer 33 (see FIG. 19E). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the allowable temperature limit of the resin layer 23. In addition, the insulating layer 34 is preferably formed at a temperature lower than or equal to the heating temperature in the above-described heating step of the resin layer 23.

Next, openings that reach the conductive layer 43b and the like are formed in the insulating layer 34 and the insulating layer 33.

Then, a conductive layer 61 is formed. Part of the conductive layer 61 functions as a pixel electrode of a display element 60. The conductive layer 61 can be formed in the following manner: a conductive film is formed, a resist mask is formed, the conductive film is etched, and the resist mask is removed.

Furthermore, the conductive layer 61 is formed at a temperature lower than or equal to the heat resistant temperature of the resin layer 23. In addition, the conductive layer 61 is preferably formed at a temperature lower than or equal to the heating temperature in the above-described heating step of the resin layer 23.

Figure 20A:
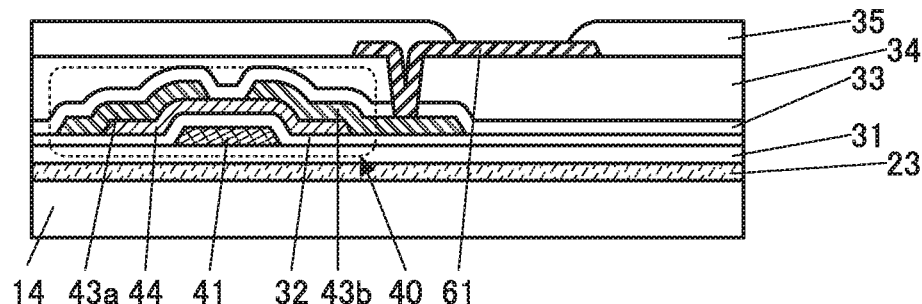
FIGS. 20A to 20C illustrate an example of a manufacturing method of a flexible device.

Next, an insulating layer 35 that covers an end portion of the conductive layer 61 is formed (see FIG. 20A). For the insulating layer 35, the description of the organic insulating film or the inorganic insulating film that can be used for the insulating layer 31 can be referred to.

The insulating layer 35 is formed at a temperature lower than or equal to the allowable temperature limit of the resin layer 23. In addition, the insulating layer 35 is preferably formed at a temperature lower than or equal to the heating temperature in the above-described heating step of the resin layer 23.

Figure 20B:
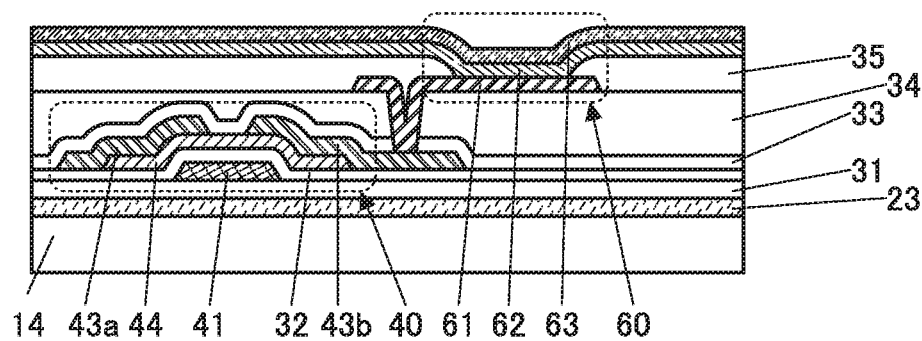

Then, an EL layer 62 and a conductive layer 63 are formed (see FIG. 20B). Part of the conductive layer 63 functions as a common electrode of the display element 60.

The EL layer 62 can be formed by an evaporation method, a coating method, a printing method, a discharge method, or the like. In the case where the EL layer 62 is formed for each individual pixel, an evaporation method using a shadow mask such as a metal mask, an ink-jet method, or the like can be used. In the case of sharing the EL layer 62 by some pixels, an evaporation method not using a metal mask can be used.

The conductive layer 63 can be formed by an evaporation method, a sputtering method, or the like.

The EL layer 62 and the conductive layer 63 are each formed at a temperature lower than or equal to the allowable temperature limit of the resin layer 23. In addition, the EL layer 62 and the conductive layer 63 are preferably formed at a temperature lower than or equal to the heating temperature in the above-described heating step of the resin layer 23.

Through the above-described steps, the display element 60 can be formed. In the display element 60, the conductive layer 61 part of which functions as a pixel electrode, the EL layer 62, and the conductive layer 63 part of which functions as a common electrode are stacked.

Although a top-emission light-emitting element is formed as the display element 60 here, one embodiment of the present invention is not limited thereto. The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Figure 20C:
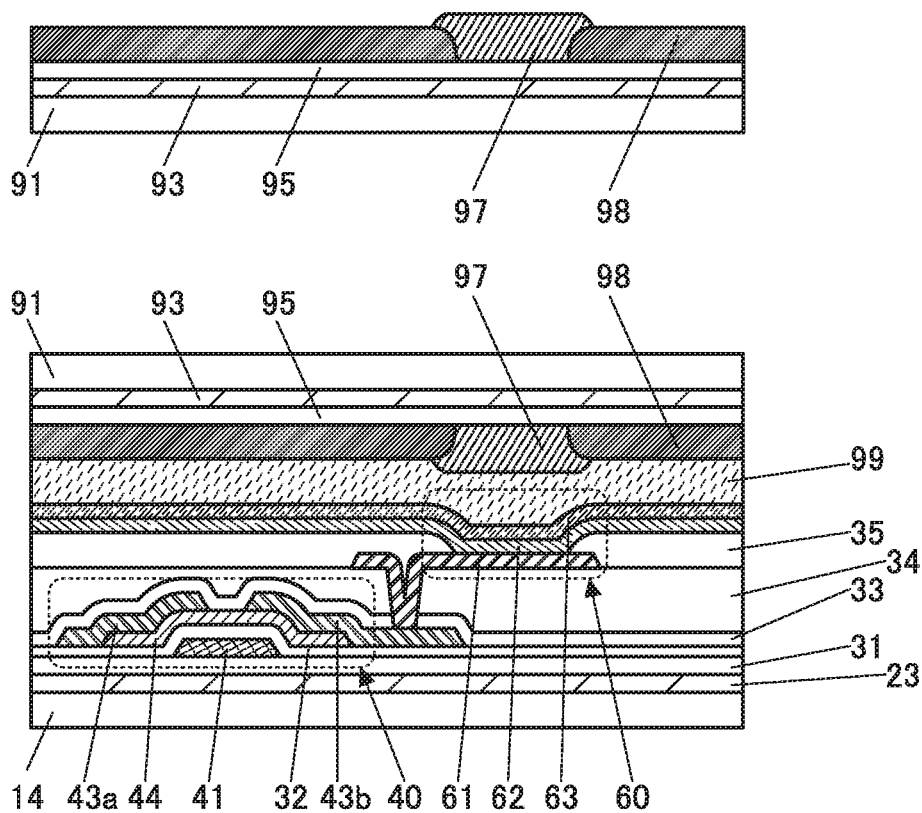

In addition, over a substrate 91, a resin layer 93 is formed using a photosensitive and thermosetting material by a method different from the above-described method (see FIG. 20C).

The resin layer 93 has flexibility. The substrate 91 has lower flexibility than the resin layer 93 does. Since the resin layer 93 is formed over the substrate 91, the resin layer 93 can be transferred easily.

For the resin layer 93, a polyimide resin is preferably used. The thickness of the resin layer 93 is preferably greater than or equal to 0.1 µm and less than or equal to 3 µm, further preferably greater than or equal to 0.5 µm and less than or equal to 1 µm. For a material and a formation method of the resin layer 93, the description of the resin layer 23 is referred to.

In the case where the resin layer 93 is positioned on the display surface side of the display device, the resin layer 93 preferably has a high visible-light transmitting property.

For the substrate 91, the description of the substrate 14 can be referred to.

Next, an insulating layer 95, a coloring layer 97, and a light-blocking layer 98 are formed over the resin layer 93 (see FIG. 20C).

For the insulating layer 95, the description of the insulating layer 31 can be referred to.

A color filter or the like can be used as the coloring layer 97. The coloring layer 97 is provided to overlap with the display region of the display element 60.

A black matrix or the like can be used as the light-blocking layer 98. The light-blocking layer 98 is provided to overlap with the insulating layer 35.

Next, a surface of the substrate 14 on which the resin layer 23 and the like are formed and a surface of the substrate 91 on which the resin layer 93 and the like are formed are attached to each other with a bonding layer 99 (see FIG. 20C).

Next, the resin layer 23 is irradiated with the laser light 65 through the substrate 14 (see FIG. 21A). Here, an example in which the substrate 14 is separated ahead of the substrate 91 is shown.

Next, the substrate 14 is separated from the stack illustrated in FIG. 21A (see FIG. 21B). FIG. 21B illustrates an example in which separation occurs in the resin layer 23. Part of the resin layer (a resin layer 23a) remains on the substrate 14. The thickness of the resin layer 23 remaining on the insulating layer 31 side is reduced as compared with that in FIG. 21A. Then, the exposed resin layer 23 and the substrate 29 are attached to each other with the bonding layer 28.

Figure 22A:
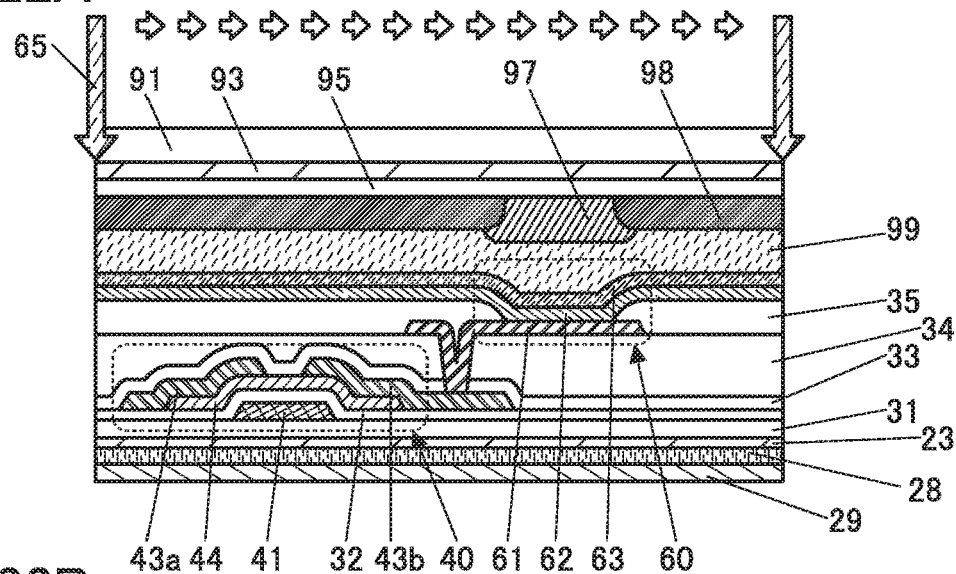
FIGS. 22A to 22C illustrate an example of a manufacturing method of a flexible device.

Next, the resin layer 93 is irradiated with the laser light 65 through the substrate 91 (see FIG. 22A).

Figure 22B:
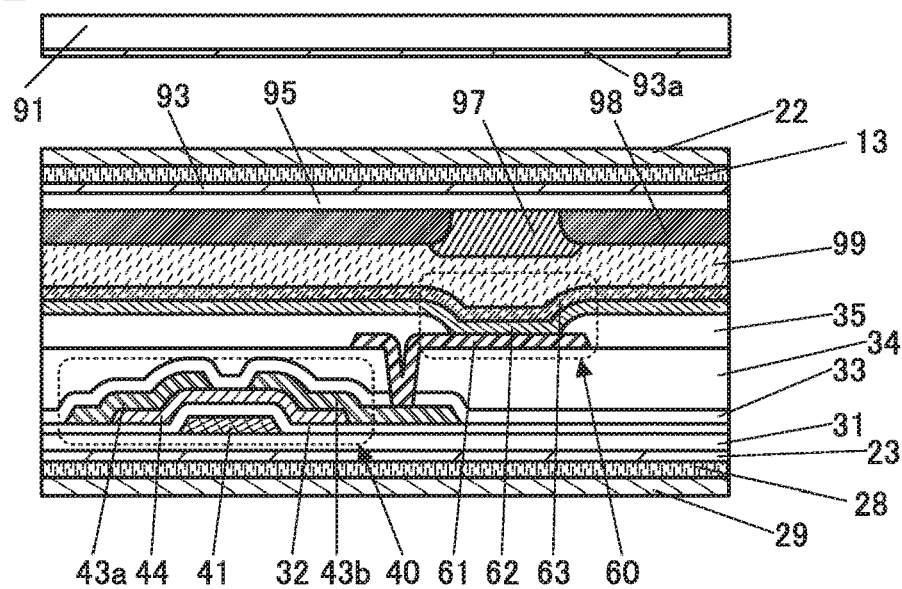

Next, the substrate 91 and the insulating layer 95 are separated from each other (see FIG. 22B). FIG. 22B illustrates an example in which separation occurs in the resin layer 93. Part of the resin layer (a resin layer 93a) remains on the formation substrate 91. The thickness of the resin layer 93 remaining on the insulating layer 95 side is reduced as compared with that in FIG. 22A. Then, the exposed resin layer 93 and the substrate 22 are attached to each other with the bonding layer 13 (see FIG. 22B).

As the bonding layers 13 and 28, any of a variety of curable adhesives such as a reactive curable adhesive, a thermosetting adhesive, an anaerobic adhesive, and a photocurable adhesive such as an ultraviolet curable adhesive can be used. Note that the mode of such an adhesive is not limited to liquid, and a sheet form may be employed.

For each of the substrates 22 and 29, a flexible substrate may be used. For example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used.

In FIG. 22B, light emitted from the display element 60 is extracted to the outside of the display device through the coloring layer 97 and the resin layer 93. Thus, the resin layer 93 preferably has high visible-light transmittance. In the separation method of one embodiment of the present invention, the thickness of the resin layer 93 can be reduced. Therefore, the visible-light transmittance of the resin layer 93 can be increased.

Figure 22C:
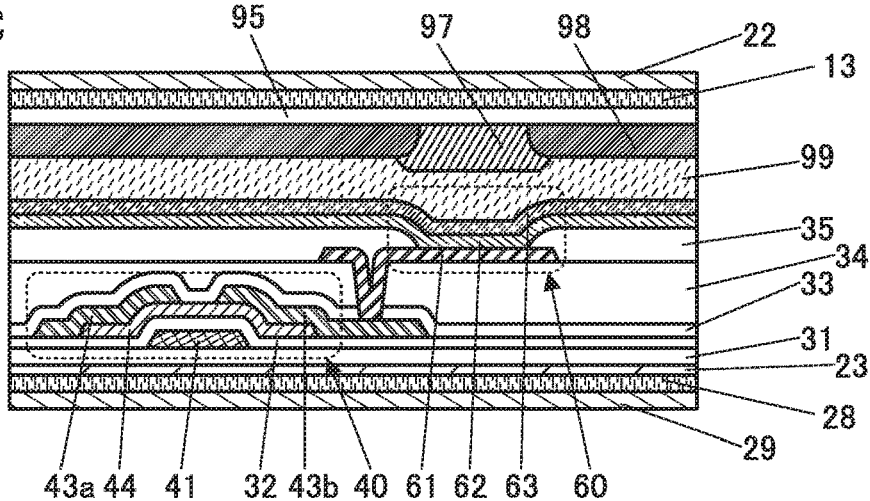

As illustrated in FIG. 22C, the resin layer 93 may be removed, and the substrate 22 may be attached to the insulating layer 95 with the bonding layer 13.

Through the above steps, the display device using an oxide semiconductor for the transistor and a color filter method for the EL element can be fabricated.

As described in this embodiment, in the separation method of one embodiment of the present invention, the fabrication process of the transistor can be performed at a low temperature. Furthermore, the resin layer can have a small thickness and low heat resistance. Thus, the material of the resin layer can be selected from a wide range, high mass productivity can be obtained at low cost, and a large substrate can be used, for example. Warpage of the flexible device due to the thickness of the resin layer can be suppressed in some cases.

This embodiment can be combined with any of other embodiments as appropriate.

Embodiment 5

In this embodiment, a flexible device of one embodiment of the present invention will be described with reference to drawings. Described in this embodiment is an example of a display device. Note that in fabrication of the display device, the laser processing apparatus or a stack processing apparatus of one embodiment of the present invention can be used.

Any of a variety of elements, such as an optical element that utilizes micro electro mechanical systems (MEMS), an EL element, a light-emitting element such as an LED, a liquid crystal element, and an electrophoretic element can be used as the display element in the display device.

The thickness of the display device to which one embodiment of the present invention is applied can be, for example, greater than or equal to 30 μm and less than or equal to 300 μm and is preferably greater than or equal to 50 μm and less than or equal to 200 μm, further preferably greater than or equal to 50 μm and less than or equal to 150 μm, and still further preferably greater than or equal to 50 μm and less than or equal to 100 μm. To increase the mechanical strength of the display device, the thickness of the display device is preferably greater than or equal to 50 μm. To increase the flexibility of the display device, the thickness of the display device is preferably less than or equal to 200 μm and further preferably less than or equal to 100 μm. A display device with a thickness less than or equal to 100 μm, for example, can be bent with a radius of curvature of 1 mm, or can be repeatedly bent (e.g., more than 100000 times) with a radius of curvature of 5 mm.

Figure 23:
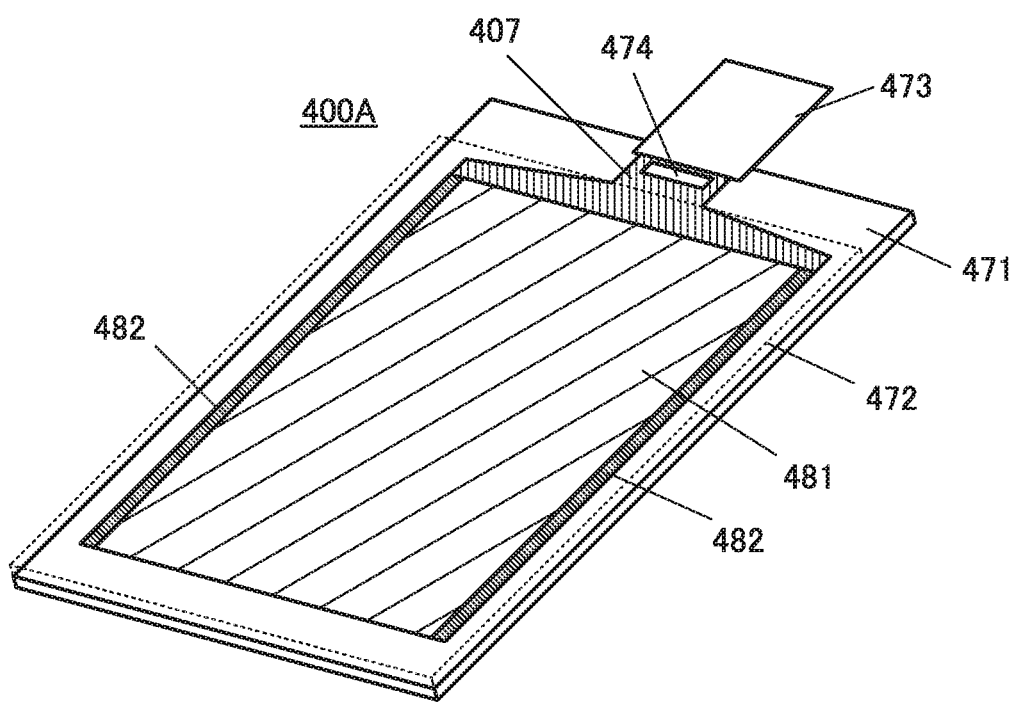
FIG. 23 is a perspective view illustrating a display device.

FIG. 23 is a schematic perspective view of a display device 400A. In the display device 400A, a substrate 471 and a substrate 472 are bonded to each other. In FIG. 23, the substrate 472 is shown by a dashed line.

The display device 400A includes a display portion 481 and a driver circuit portion 482. A flexible printed circuit (FPC) 473 and an IC 474 are mounted on the display device 400A.

The display portion 481 includes a plurality of pixels and has a function of displaying images.

A pixel includes a plurality of sub-pixels. For example, a subpixel exhibiting red, a subpixel exhibiting green, and a subpixel exhibiting blue can form one pixel, leading to full-color display in the display portion 481. Note that the color exhibited by subpixels is not limited to red, green, and blue. A pixel may be composed of subpixels that exhibit colors of white, yellow, magenta, or cyan, for example. In this specification and the like, a subpixel may be simply described as a pixel.

The display device 400A may include either or both a scan line driver circuit and a signal line driver circuit. The display device 400A may include neither the scan line driver circuit nor the signal line driver circuit. When the display device 400A includes a sensor such as a touch sensor, the display device 400A may include a sensor driver circuit. In an example described in this embodiment, a scan line driver circuit is included as the driver circuit portion 482. The scan line driver circuit has a function of outputting a scan signal to a scan line included in the display portion 481.

In the display device 400A, the IC 474 is mounted on the substrate 471 by a chip on glass (COG) method or the like. The IC 474 includes, for example, any one or more of a signal line driver circuit, a scan line driver circuit, and a sensor driver circuit.

The FPC 473 is electrically connected to the display device 400A. Through the FPC 473, a signal and power from the outside are supplied to the IC 474 and the driver circuit portion 482. In addition, a signal from the IC 474 can be output to the outside through the FPC 473.

An IC may be mounted on the FPC 473 by a chip on film (COF) method or the like. For example, an IC including any one or more of a signal line driver circuit, a scan line driver circuit, and a sensor driver circuit may be mounted on the FPC 473.

A signal and power are supplied to the display portion 481 and the driver circuit portion 482 through a wiring 407. The signal and power are input to the wiring 407 from the IC 474 or from the outside through the FPC 473.

FIG. 24A is a cross-sectional view of the display device 400A, illustrating the display portion 481, the driver circuit portion 482, and the wiring 407. The display device 400A is a top-emission display device using a color filter method.

The display device 400A includes the substrate 471, an insulating layer 478, a plurality of transistors, a capacitor 405, the wiring 407, an insulating layer 412, an insulating layer 413, an insulating layer 414, an insulating layer 415, a light-emitting element 404, a conductive layer 455, a spacer 416, an adhesive layer 417, a coloring layer 425, a light-blocking layer 426, an insulating layer 476, and the substrate 472.

Each of the substrate 471 and the substrate 472 may include a resin layer separated from a substrate by the separation method of one embodiment of the present invention. Alternatively, each of the substrate 471 and the substrate 472 may include a film. The film is attached, with an adhesive or the like, on a surface separated from the substrate by the separation method of one embodiment of the present invention.

The driver circuit portion 482 includes a transistor 401. The display portion 481 includes a transistor 402 and a transistor 403.

Each of the transistors includes a gate, the insulating layer 411, a semiconductor layer, a source, and a drain. The gate and the semiconductor layer overlap with each other with the insulating layer 411 provided therebetween. Part of the insulating layer 411 functions as a gate insulating layer, and another part of the insulating layer 411 functions as a dielectric of the capacitor 405. A conductive layer that functions as the source or the drain of the transistor 402 also functions as one electrode of the capacitor 405.

The transistors illustrated in FIG. 24A have bottom-gate structures. The transistors in the driver circuit portion 482 and the transistors in the display portion 481 may have different structures. The driver circuit portion 482 and the display portion 481 may each include a plurality of kinds of transistors.

The capacitor 405 includes a pair of electrodes and the dielectric therebetween. The capacitor 405 includes a conductive layer that is formed using the same material and the same process as the gates of the transistors, and a conductive layer that is formed using the same material and the same process as the sources and the drains of the transistors.

The insulating layer 412, the insulating layer 413, and the insulating layer 414 are each provided to cover the transistors and the like. The number of the insulating layers covering the transistors and the like is not particularly limited. The insulating layer 414 has a function as a planarization layer. It is preferred that at least one of the insulating layer 412, the insulating layer 413, and the insulating layer 414 be formed using a material inhibiting diffusion of impurities such as water and hydrogen. Diffusion of impurities from the outside into the transistors can be effectively inhibited, leading to improved reliability of the display device.

In FIG. 24A, the insulating layer 414 is provided all over the display device. The structure illustrated in FIG. 24A is preferable because the yield of the fabrication process of a flexible device of one embodiment of the present invention can be increased.

In the case of using an organic material for the insulating layer 414, impurities such as moisture might enter the light-emitting element 404 or the like from the outside of the display device through the insulating layer 414 exposed at an end portion of the display device. Deterioration of the light-emitting element 404 due to the entry of impurities can lead to deterioration of the display device. For this reason, the insulating layer 414 is preferably not positioned at the end portion of the display device, as illustrated in FIG. 24B. Since an insulating layer formed using an organic material is not positioned at the end portion of the display device in the structure of FIG. 24B, entry of impurities into the light-emitting element 404 can be inhibited.

The light-emitting element 404 includes an electrode 421, an EL layer 422, and an electrode 423. The light-emitting element 404 may include an optical adjustment layer 424. The light-emitting element 404 has a top-emission structure with which light is emitted to the coloring layer 425 side.

The transistors, the capacitor, the wiring, and the like are positioned so as to overlap with a light-emitting region of the light-emitting element 404; accordingly, the aperture ratio of the display portion 481 can be increased.

One of the electrode 421 and the electrode 423 functions as an anode and the other functions as a cathode. When a voltage higher than the threshold voltage of the light-emitting element 404 is applied between the electrode 421 and the electrode 423, holes are injected to the EL layer 422 from the anode side and electrons are injected to the EL layer 422 from the cathode side. The injected electrons and holes are recombined in the EL layer 422 and a light-emitting substance contained in the EL layer 422 emits light.

The electrode 421 is electrically connected to a source or a drain of the transistor 403. They may be directly connected to each other or may be connected via another conductive layer. The electrode 421 functioning as a pixel electrode is provided for each light-emitting element 404. Two adjacent electrodes 421 are electrically insulated from each other by the insulating layer 415.

The EL layer 422 contains a light-emitting substance.

The electrode 423 functioning as a common electrode is shared by a plurality of light-emitting elements 404. A fixed potential is supplied to the electrode 423.

The light-emitting element 404 overlaps with the coloring layer 425 with the adhesive layer 417 provided therebetween. The spacer 416 overlaps with the light-blocking layer 426 with the adhesive layer 417 provided therebetween. Although FIG. 24A illustrates the case where a space is provided between the electrode 423 and the light-blocking layer 426, the electrode 423 and the light-blocking layer 426 may be in contact with each other. Although the spacer 416 is provided on the substrate 471 side in the structure illustrated in FIG. 24A, the spacer 416 may be provided on the substrate 472 side (e.g., in a position closer to the substrate 471 than that of the light-blocking layer 426).

Owing to the combination of a color filter (the coloring layer 425) and a microcavity structure (the optical adjustment layer 424), light with high color purity can be extracted from the display device. The thickness of the optical adjustment layer 424 is varied depending on the color of the pixel.

The coloring layer 425 is a coloring layer that transmits light in a specific wavelength range. For example, a color filter for transmitting light in a red, green, blue, or yellow wavelength range can be used.

Note that one embodiment of the present invention is not limited to a color filter method, and a separate coloring method, a color conversion method, a quantum dot method, and the like may be employed.

The light-blocking layer 426 is provided between the adjacent coloring layers 425. The light-blocking layer 426 blocks light emitted from an adjacent light-emitting element 404 to inhibit color mixture between adjacent light-emitting elements 404. Here, the coloring layer 425 is provided such that its end portion overlaps with the light-blocking layer 426, whereby light leakage can be reduced. For the light-blocking layer 426, a material that blocks light emitted from the light-emitting element can be used. Note that it is preferable to provide the light-blocking layer 426 in a region other than the display portion 481, such as a driver circuit portion 482, in which case undesired leakage of guided light or the like can be inhibited.

As illustrated in FIG. 24B, the display device of one embodiment of the present invention may include an overcoat 436 that covers the coloring layer 425 and the light-blocking layer 426. The overcoat 436 can prevent impurities and the like contained in the coloring layer 425 from being diffused into the light-emitting element. The overcoat 436 is formed with a material that transmits light emitted from the light-emitting element; for example, an inorganic insulating film such as a silicon nitride film or a silicon oxide film, or an organic insulating film such as an acrylic film or a polyimide film can be used, and further, a stacked-layer structure of an organic insulating film and an inorganic insulating film may be employed.

In the case where a material of the adhesive layer 417 is applied to the coloring layer 425 and the light-blocking layer 426, a material with high wettability with respect to the material of the adhesive layer 417 is preferably used as a material of the overcoat 436. For example, an oxide conductive film such as an indium tin oxide (ITO) film or a metal film such as an Ag film which is thin enough to transmit light is preferably used as the overcoat 436.

When the overcoat 436 is formed using a material that has high wettability with respect to the material for the adhesive layer 417, the material for the adhesive layer 417 can be uniformly applied. Thus, entry of bubbles in the step of attaching the pair of substrates to each other can be prevented, and thus a display defect can be prevented.

The insulating layer 478 is formed on a surface of the substrate 471. The insulating layer 476 is formed on a surface of the substrate 472. The insulating layer 476 and the insulating layer 478 are preferably highly resistant to moisture. The light-emitting element 404, the transistors, and the like are preferably provided between a pair of insulating layers which are highly resistant to moisture, in which case impurities such as water can be prevented from entering these elements, leading to an increase in the reliability of the display device.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the water vapor transmittance of the insulating film having an excellent moisture-proof property is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], and still further preferably lower than or equal to $1 \times 10^{-8}$ [g/(m$^2$·day)].

A connection portion 406 includes the wiring 407 and the conductive layer 455. The wiring 407 is electrically connected to the conductive layer 455. The wiring 407 can be formed using the same material and the same process as those of the sources and the drains of the transistors. The conductive layer 455 is electrically connected to an external input terminal through which a signal and a potential from the outside are transmitted to the driver circuit portion 482.

Here, an example in which the FPC 473 is provided as the external input terminal is described. The FPC 473 is electrically connected to the conductive layer 455 through a connection layer 419.

The connection layer 419 can be formed using any of various kinds of anisotropic conductive films (ACF), anisotropic conductive pastes (ACP), and the like.

This embodiment can be combined with any of other embodiments as appropriate.

Embodiment 6

In this embodiment, electronic devices using a flexible device that can be fabricated with a processing apparatus of one embodiment of the present invention will be described with reference to drawings.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

Figure 25A:
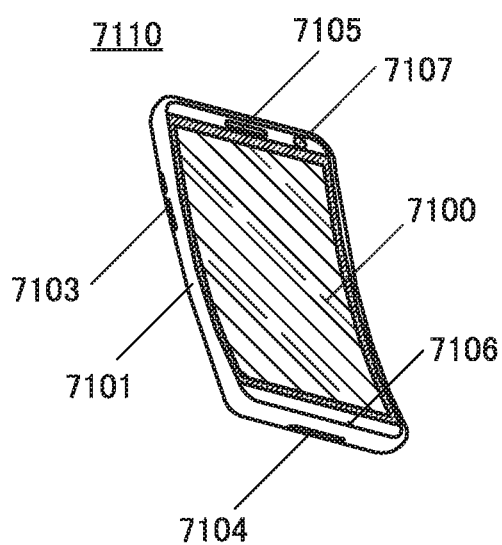
FIGS. 25A to 25F illustrate electronic devices.
Figure 25B:
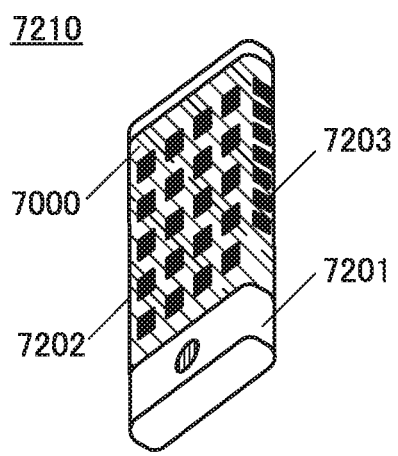
Figure 25C:
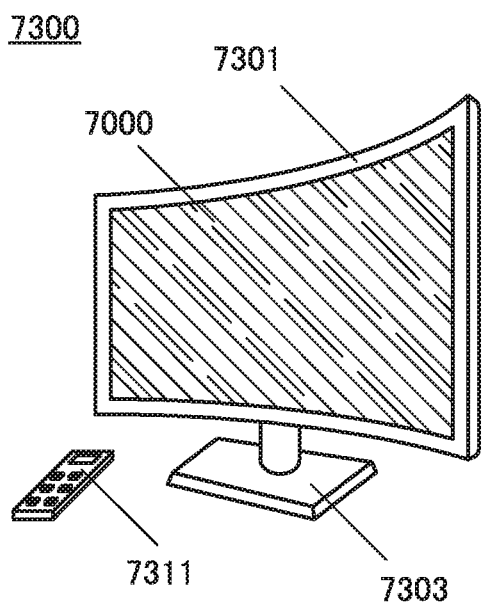

FIGS. 25A to 25C each illustrate an example of an electronic device including a display portion 7000 with a curved surface. The display surface of the display portion 7000 is curved, and images can be displayed on the curved display surface. Note that the display portion 7000 may be flexible.

FIG. 25A illustrates an example of mobile phone. A mobile phone 7110 illustrated in FIG. 25A includes a housing 7101, the display portion 7000, operation buttons 7103, an external connection port 7104, a speaker 7105, a microphone 7106, a camera 7107, and the like.

The mobile phone 7110 includes a touch sensor in the display portion 7000. Operations such as making a call and inputting a character can be performed by touch on the display portion 7000 with a finger, a stylus, or the like.

The power can be turned on or off with the operation button 7103. In addition, types of images displayed on the display portion 7000 can be switched; for example, switching images from a mail creation screen to a main menu screen is performed with the operation button 7103.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

FIG. 25B illustrates an example of a portable information terminal. A portable information terminal 7210 illustrated in FIG. 25B includes a housing 7201 and a display portion 7000. Each of the portable information terminals may also include an operation button, an external connection port, a speaker, a microphone, an antenna, a camera, a battery, or the like. The display portion 7000 is provided with a touch sensor. An operation of the portable information terminal can be performed by touching the display portion 7000 with a finger, a stylus, or the like.

The portable information terminal illustrated in this embodiment functions as, for example, one or more of a telephone set, a notebook, and an information browsing system. Specifically, each of the portable information terminals can be used as a smartphone. Each of the portable information terminals illustrated in this embodiment is capable of executing, for example, a variety of applications such as mobile phone calls, e-mailing, reading and editing texts, music reproduction, Internet communication, and a computer game.

The portable information terminal 7210 can display characters, image information, and the like on its plurality of surfaces. For example, three operation buttons 7202 can be displayed on one surface, and information 7203 indicated by a rectangle can be displayed on another surface. FIG. 25B illustrates an example in which the operation buttons 7202 are displayed at the top of the portable information terminal 7210 and the information 7203 is displayed on the side of the portable information terminal 7210. Note that the operation buttons 7202 may be displayed on the side of the portable information terminal 7210 and the information 7203 may be displayed at the top of the portable information terminal 7210, for example. Information may be displayed on three or more surfaces of the portable information terminal 7210.

Examples of the information 7203 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information 7203.

FIG. 25C illustrates an example of a television set. In a television set 7300, the display portion 7000 is incorporated into a housing 7301. Here, the housing 7301 is supported by a stand 7303.

The television set 7300 illustrated in FIG. 25C can be operated with an operation switch of the housing 7301 or a separate remote controller 7311. Furthermore, the display portion 7000 may include a touch sensor. The display portion 7000 can be operated by touching the display portion 7000 with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, or the like. With use of the receiver, general television broadcasting can be received. When the television set is connected to a communication network with or without wires via the modem, one-way (from a transmitter to a receiver) or two-way (between a transmitter and a receiver or between receivers) data communication can be performed.

Figure 25D:
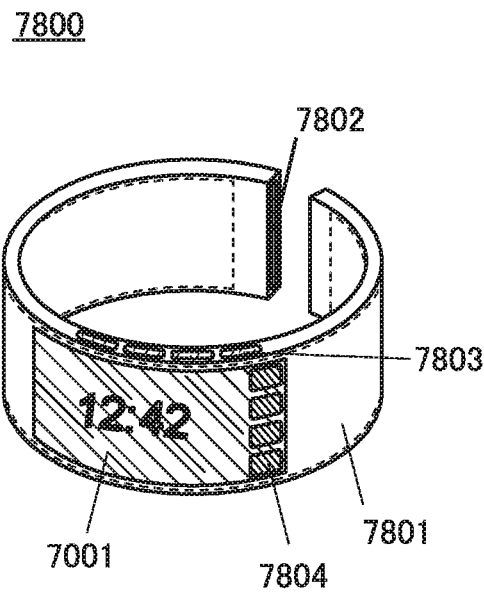
Figure 25E:
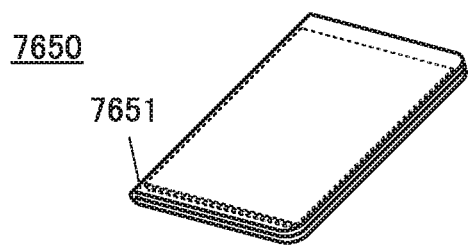
Figure 25F:
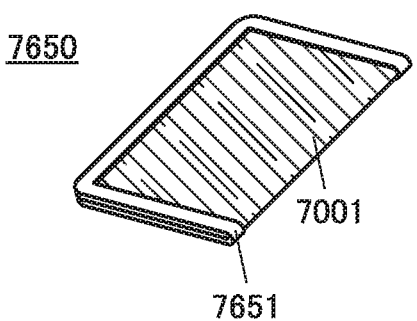

FIGS. 25D to 25F each illustrate an example of a portable information terminal including a flexible and bendable display portion 7001.

The display portion 7001 is fabricated using the display device or the like of one embodiment of the present invention. For example, a display device that can be bent with a radius of curvature greater than or equal to 0.01 mm and less than or equal to 150 mm can be used. The display portion 7001 may include a touch sensor so that the portable information terminal can be operated by touching the display portion 7001 with a finger or the like. The display portion 7001 can be fabricated using the display device or the like formed with a processing apparatus of one embodiment of the present invention.

FIG. 25D illustrates an example of a wrist-watch-type portable information terminal. A portable information terminal 7800 includes a band 7801, the display portion 7001, an input/output terminal 7802, operation buttons 7803, and the like. The band 7801 has a function of a housing. In addition, a flexible battery 7805 can be mounted on the portable information terminal 7800. The battery 7805 may be arranged to overlap with the display portion 7001, or the band 7801 and the like, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

Alternatively, the portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by non-contact power transmission without using the input/output terminal.

FIGS. 25E and 25F illustrate an example of a foldable portable information terminal. FIG. 25E illustrates a portable information terminal 7650 that is folded so that the display portion 7001 is on the inside. FIG. 25F illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged. Note that FIGS. 25E and 25F each illustrate a structure in which the portable information terminal 7650 is folded in two; however, the portable information terminal 7650 may be folded in three or four or more. The portable information terminal 7650 may include an operation button, an external connection port, a speaker, a microphone, an antenna, a camera, a battery, or the like.

This embodiment can be combined with any of other embodiments as appropriate.

This application is based on Japanese Patent Application Serial no. 2016-096205 filed with Japan Patent Office on May 12, 2016, the entire contents of which are hereby incorporated by reference.

What is claimed is:

1. A laser processing apparatus comprising:
a laser oscillator;
an optical system unit;
a fixing mechanism of a structure that is to be processed;
a first mirror;
a second mirror;
a third mirror;
a fourth mirror;
a first lens; and
a second lens;
wherein the optical system unit is configured to extend and shape a first laser light emitted from the laser oscillator into a second laser light,
wherein the fixing mechanism comprises a stage fixing the structure and a driving mechanism moving the stage in a horizontal direction,
wherein the first mirror is configured to reflect the second laser light to be incident on the first lens,
wherein the first lens is configured to condense the second laser light from the first mirror to form a first linear beam,
wherein the second mirror is configured to reflect the second laser light to be incident on the third mirror,
wherein the third mirror is configured to reflect the second laser light from the second mirror to be incident on the fourth mirror,
wherein the fourth mirror is configured to reflect the second laser light from the third mirror to be incident on the second lens,
wherein the second lens is configured to condense the second laser light from the fourth mirror to form a second linear beam,
wherein the stage is configured to transmit the second laser light from the second lens,
wherein a position of the first mirror is capable of being changed, so that the second laser light is incident on the first mirror or the second mirror selectively,
wherein the fixing mechanism comprises a region overlapping with the optical system unit by a movement operation in a horizontal direction, and
wherein the fixing mechanism is moved while the first laser light is emitted from the laser oscillator, whereby a desired region of the structure is irradiated with the first linear beam or the second linear beam.

2. The laser processing apparatus according to claim 1, wherein the stage comprises a quartz plate.

3. The laser processing apparatus according to claim 1, wherein the fixing mechanism is located between the first lens and the second lens.

4. The laser processing apparatus according to claim 1, further comprising a chamber comprising a first quartz window and a second quartz window,
   wherein the fixing mechanism, the third mirror, the fourth mirror, and the second lens are located in the chamber,
   wherein the second laser light transmitted through the first lens is shaped into a first linear beam through the first quartz window, and
   wherein the second laser light reflected by the second mirror is incident on the third mirror through the second quartz window.

5. The laser processing apparatus according to claim 1, further comprising a chamber comprising a first quartz window, a second quartz window, a third quartz window, and a fourth quartz window,
   wherein the fixing mechanism, the third mirror, the fourth mirror, and the second lens are located in the chamber,
   wherein the second laser light transmitted through the first lens is shaped into a first linear beam through the first quartz window,
   wherein the second laser light reflected by the second mirror is incident on the third mirror through the second quartz window and the third quartz window, and
   wherein the second laser light transmitted through the second lens is shaped into a second linear beam through the fourth quartz window.

6. A laser processing apparatus comprising:
   a laser oscillator;
   an optical system unit;
   a fixing mechanism of a structure that is to be processed;
   a first mirror;
   a second mirror;
   a third mirror;
   a first lens; and
   a second lens;
   wherein the optical system unit is configured to extend and shape a first laser light emitted from the laser oscillator into a second laser light,
   wherein the fixing mechanism comprises a stage fixing the structure and a driving mechanism moving the stage in a horizontal direction,
   wherein the first mirror is configured to reflect the second laser light,
   wherein a position of the first mirror is capable of being changed so that second laser light reflected by first mirror is incident on the first lens or the second mirror selectively,
   wherein the first lens is configured to condense the second laser light from the first mirror to form a first linear beam,
   wherein the second mirror is configured to reflect the second laser light from the first mirror to be incident on the third mirror,
   wherein the third mirror is configured to reflect the second laser light from the second mirror to be incident on the second lens,
   wherein the second lens is configured to condense the second laser light from the third mirror to form a second linear beam,
   wherein the stage is configured to transmit the second laser light from the second lens,
   wherein the fixing mechanism comprises a region overlapping with the optical system unit by a movement operation in a horizontal direction, and
   wherein the fixing mechanism is moved while the first laser light is emitted from the laser oscillator, whereby a desired region of the structure is irradiated with the first linear beam or the second linear beam.

* * * * *